(12) United States Patent
Ahn et al.

(10) Patent No.: US 7,211,512 B1
(45) Date of Patent: May 1, 2007

(54) SELECTIVE ELECTROLESS-PLATED COPPER METALLIZATION

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/483,881

(22) Filed: Jan. 18, 2000

(51) Int. Cl.
H01L 21/44 (2006.01)

(52) U.S. Cl. .......... 438/678; 438/622; 438/678; 438/638; 257/E21.582; 257/E21.583; 257/E21.584

(58) Field of Classification Search .......... 438/619, 438/622, 687, 678, 637–640
See application file for complete search history.

(56) References Cited

U.S. PATENT DOCUMENTS

| | | | |
|---|---|---|---|
| 2,842,438 A | | 7/1958 | Saarivirta et al. .......... 75/153 |
| 4,394,223 A | * | 7/1983 | Hall |
| 4,565,157 A | | 1/1986 | Brors et al. |
| 4,762,728 A | | 8/1988 | Keyser et al. .......... 427/38 |
| 4,847,111 A | | 7/1989 | Chow et al. .......... 427/38 |
| 4,948,459 A | | 8/1990 | van Laarhoven et al. ... 156/643 |
| 4,962,058 A | | 10/1990 | Cronin et al. .......... 437/187 |
| 5,034,799 A | * | 7/1991 | Tomita et al. |
| 5,043,299 A | | 8/1991 | Chang et al. |
| 5,084,412 A | | 1/1992 | Nakasaki .......... 437/189 |
| 5,130,274 A | | 7/1992 | Harper et al. .......... 437/195 |
| 5,158,986 A | | 10/1992 | Cha et al. .......... 521/82 |
| 5,173,442 A | | 12/1992 | Carey .......... 437/173 |
| 5,180,687 A | | 1/1993 | Mikoshiba et al. |
| 5,231,056 A | | 7/1993 | Sandhu .......... 437/200 |
| 5,348,811 A | | 9/1994 | Nagao et al. |
| 5,371,042 A | | 12/1994 | Ong .......... 437/194 |
| 5,413,687 A | | 5/1995 | Barton et al. .......... 204/192.14 |

(Continued)

FOREIGN PATENT DOCUMENTS

| | | |
|---|---|---|
| JP | 5-267643 | 10/1993 |
| JP | 07-321111 | 8/1995 |

OTHER PUBLICATIONS

Eisenbraun, E.T.,et al. ,"Selective and Blanket Low–Temperature Copper CVD for Multilevel Metallization in ULSI", *Conference Proceedings ULSI–VII*, (1992),5 pages.

(Continued)

*Primary Examiner*—Ha Nguyen
*Assistant Examiner*—Kyoung Lee
(74) *Attorney, Agent, or Firm*—Schwegman, Lunberg, Woessner & Kluth, P.A.

(57) ABSTRACT

Structures and methods are provided which include a selective electroless copper metallization. The present invention includes a novel methodology for forming copper vias on a substrate. This method includes depositing a thin film seed layer of Palladium (Pd) or Copper (Cu) on a substrate. The seed layer is deposited to a thickness of less than 15 nanometers (nm). A photolithography technique is used to define a number of via holes above the seed layer. In one embodiment, using a photolithography technique includes forming a patterned photoresist layer to define the number of via holes above the seed layer. A layer of copper is deposited over the seed layer using electroless plating filling the number of via holes to a top surface of the patterned photoresist layer. The method can be repeated any number of times depositing a second seed layer, depositing another patterned photoresist layer defining a number of conductor line openings above the second seed layer, and forming a second layer of copper using electroless plating which fills the number of conductor line openings to a top surface of the second patterned photoresist layer. The photoresist layers along with the seed layers in other regions can then be removed, such as by oxygen plasma etching, such that a chemical mechanical planarization process is avoided. Structures formed by this novel process are similarly included within the scope of the present invention.

39 Claims, 7 Drawing Sheets

U.S. PATENT DOCUMENTS

| | | | |
|---|---|---|---|
| 5,447,887 A | 9/1995 | Filipiak et al. | 437/200 |
| 5,572,072 A | 11/1996 | Lee | |
| 5,595,937 A | 1/1997 | Mikagi | 437/192 |
| 5,609,721 A | 3/1997 | Tsukune et al. | 156/646.1 |
| 5,654,245 A | 8/1997 | Allen | 438/629 |
| 5,670,420 A | 9/1997 | Choi | 437/189 |
| 5,719,089 A | 2/1998 | Cherng et al. | 438/637 |
| 5,763,953 A | 6/1998 | Iljima et al. | 257/762 |
| 5,824,599 A | 10/1998 | Schacham-Diamand et al. | 438/678 |
| 5,891,797 A | 4/1999 | Farrar | 438/619 |
| 5,895,740 A | 4/1999 | Chien et al. | 430/313 |
| 5,907,772 A | 5/1999 | Iwasaki | 438/253 |
| 5,948,467 A | 9/1999 | Nguyen et al. | 427/99 |
| 5,962,923 A | 10/1999 | Xu et al. | 257/774 |
| 5,972,179 A | 10/1999 | Chittipeddi et al. | 204/192.17 |
| 5,989,623 A | 11/1999 | Chen et al. | 427/97 |
| 5,994,777 A | 11/1999 | Farrar | 257/758 |
| 6,001,736 A | 12/1999 | Kondo et al. | |
| 6,015,465 A | 1/2000 | Kholodenko et al. | 118/719 |
| 6,017,820 A | 1/2000 | Ting et al. | |
| 6,071,810 A | 6/2000 | Wada et al. | 438/635 |
| 6,136,095 A | 10/2000 | Xu et al. | 118/719 |
| 6,139,699 A | 10/2000 | Chiang et al. | 204/192.15 |
| 6,140,228 A | 10/2000 | Shan et al. | 438/653 |
| 6,140,234 A * | 10/2000 | Uzoh et al. | |
| 6,143,646 A | 11/2000 | Wetzel | 438/637 |
| 6,153,507 A | 11/2000 | Mikagi | 438/618 |
| 6,171,661 B1 | 1/2001 | Zheng et al. | 427/535 |
| 6,177,350 B1 | 1/2001 | Sundarrajan et al. | 438/688 |
| 6,183,564 B1 | 2/2001 | Reynolds et al. | 118/719 |
| 6,190,732 B1 | 2/2001 | Omstead et al. | 118/729 |
| 6,197,688 B1 | 3/2001 | Simpson | 438/678 |
| 6,207,222 B1 | 3/2001 | Chen et al. | 427/97 |
| 6,211,073 B1 | 4/2001 | Ahn et al. | 438/653 |
| 6,232,219 B1 | 5/2001 | Blalock et al. | 438/637 |
| 6,249,056 B1 | 6/2001 | Kwon et al. | 257/758 |
| 6,251,781 B1 | 6/2001 | Zhou et al. | |
| 6,265,311 B1 | 7/2001 | Hautala et al. | 438/680 |
| 6,271,592 B1 | 8/2001 | Kim et al. | 257/751 |
| 6,303,498 B1 | 10/2001 | Chen et al. | |
| 6,303,505 B1 | 10/2001 | Ngo et al. | |
| 6,365,511 B1 | 4/2002 | Kizilyalli et al. | |
| 6,372,622 B1 * | 4/2002 | Tan et al. | |
| 6,387,542 B1 * | 5/2002 | Kozlov et al. | |
| 6,403,481 B1 * | 6/2002 | Matsuda et al. | |

OTHER PUBLICATIONS

Fukuda, T.,et al. ,"0.5–micrometer–Pitch Copper–Dual–Damascene Metallization Using Organic SOG (k=2.9) for 0.18–micrometer CMOS Applications", *IEEE*, (1999),pp. 619–622.
Hirao, S.,"A Novel Copper Reflow Process Using Dual Wetting Layers", *Symposium on VLSI Technology*, Digest of Technical Papers,(1997),57–58.
Kaloyeros, A.E. ,et al. ,"Blanket and Selective Copper CVD from Cu(FOD)2 for Multilevel Metallization", *Mat. Res. Soc. Symp. Proc.*, vol. 181,(1990),6 pages.
Klaus, J.W. ,"Atomic Layer Deposition of Tungsten Nitride Films Using Sequential Surface Reactions", *Journal of the Electrochemical Society*, 147(3),(2000),pp. 1175–1181.
Min, Jae–Sik.,"Metal–Organic Atomic–Layer Deposition of Titanium–Silicon–Nitride Films", *Applied Physics Letters*, vol. 75, No. 11,(1999),pp. 1521–1523.
Venkatesan, S.,"A High Performance 1.8V, 0.20 micrometer CMOS Technology with Copper Metallization", *IEEE*, (1997),pp. 769–772.

Shacham–Diamand, Y., et al., "Copper electroless deposition technology for ultra–large–scale–integration (ULSI) metallization", *Microelectronic Engineering, NL*, vol. 33, No. 1, XP004054497, 47–58, (1997).
Stroud, P.T., et al., "Preferential deposition of silver induced by low energy gold ion implantation", *Thin Solid Films, Switzerland*, vol. 9, No. 2, XP000993098, 273–281, (Feb. 1972).
"Brooks Model 5964 High Performance Metal Seal Mass Flow Controller (Introduced in 1991)", *Brooks Instrument*, http://www.frco.com/brooks/semiconductor/products1i.html, 1 page, (1991).
Andricacos, P.C., "Copper On–Chip Interconnections", *The Electrochemical Society Interface*, pp. 32–37, (1999).
Anonymous, "Improved Metallurgy for Wiring Very Large Scale Integrated Circuits", *International Technology Disclosures, 4*, Abstract, 1 page, (1986).
Bae, S., et al., "Low–Temperature Deposition Pathways to Silicon Nitride, Amorphous Silicon, Polycrystalline Silicon, and n type Amorphous Silicon Films Using a High Density Plasma System", *IEEE Conference Records—Abstracts, International Conference on Plasma Science*, p. 315, (1997).
Bernier, M., et al., "Laser processing of palladium for selective electroless copper plating", *SPIE, 2045*, pp. 330–337, (1994).
Bhansali, S., et al., "A novel technique for fabrication of metallic structures on polymide by selective electroless copper plating using ion implantation", *Thin Solid Films, 270*, pp. 489–492, (1995).
Bhansali, S., et al., "Selective electroless copper plating on silicon seeded by copper ion implantation", *Thin Solid Films, 253*, pp. 391–394, (1994).
Braud, E., et al., "Ultra Thin Diffusion Barriers for Cu Interconnections at The Gigabit Generation and Beyond", *VMIC Conference Proceedings*, pp. 174–179, (1996).
Cabrera, A.L., et al., "Oxidation protection for a variety of transition metals and copper via surface silicides formed with silane containing atmospheres", *J. Mater. Res., 6(1)*, pp. 71–79, (1991).
de Felipe, T.S., et al., "Electrical Stability and Microstructural Evolution in Thin Films of High Conductivity Copper Alloys", *IEEE*, pp. 293–295, (1999).
Ding, et al., "Copper Barrier, Seed Layer and Planerization Technologies", *VMIC Conference Proceedings*, pp. 87–92, (1997).
Dubin, V.M., et al., "Selective and Blanket Electroless Copper Deposition for Ultralarge Scale Integration", *J. Electrochem. Soc., 144(3)*, pp. 898–908, (1997).
Dushman, S., et al., *Scientific Foundations of Vacuum Technique*, 2nd Edition, John Wiley and Sons, 1–806, (1962).
Edelstein, D., et al., "Full Copper Wiring in a Sub–0.25 micrometer CMOS ULSI Technology", *IEDM*, pp. 773–776, (1997).
Eldridge, J.M., "New Approaches for Investigating Corrosion in Thin Film Devices", *Electronic Packaging and Corrosion in Microelectronics, PRoceedings of ASM's Third Conference on Electric Packaging: Materials and Processes & Corrosion in Microelectronics*, Mpls, MN, pp. 283–285, (1987).
Gladlfelter, W.L., et al., "Trimethylamine Complexes of Alane as Precursors for the Low–Pressure Chemical Vapor Deposition of Aluminum", *Chemistry of Materials, 1*, pp. 339–343, (1989).

Godbey, D.J., et al., "Copper Diffusion in Organic Polymer Resists and Inter–level Dielectrics", *Thin Solid Films*, *308–309*, pp. 470–474, (1997).

Grimblot, J., et al., "II. Oxidation of Al Films", *J. Electrochem.*, *129*, pp. 2369–2372, (1982).

Hattangady, S.V., et al., "Integrated processing of silicon oxynitride films by combined plasma and rapid–thermal processing", *J. Vac. Sci. Technol. A, 14(6)*, pp. 3017–3023, (1996).

Hirata, A., et al., "WSiN Diffusion Barrier Formed by ECR Plasma Nitridation for Copper Damascene Interconnection", *16th Solid State Devices and Materials*, pp. 260–261, (1998).

Holloway, K., et al., "Tantalum as a diffusion barrier between copper and silicon", *Appl. Phys. Lett., 57(17)*, pp. 1736–1738, (Oct. 1990).

Hu, C.K., et al., "Extendibility of Cu Damascene to 0.1 micrometer Wide Interconnections", *Mat. Res. Soc. Symp. Proc, 514*, pp. 287–292, (1998).

Hymes, S., et al., "Passivation of Copper by Silicide Formation in Dilute Silane", *Conference Proceedings ULSI–VII*, pp. 425–431, (1992).

Iijima, T., et al., "Microstructure and Electrical Properties of Amorphous W–Si–N Barrier Layer for Cu Interconnections", *1996 VMIC Conference*, pp. 168–173, (1996).

Jeon, Y., et al., "Low–Temperature Fabrication of Polycrystalline Silicon Thin Films by ECR Pecvd", *The Electrochemical Society Proceedings, 94(35)*, pp. 103–114, (1995).

Kamins, T.I., "Structure and Properties of LPCVD Silicon Films", *J. Electrochem. Soc.: Solid–State Science and Technology, 127*, pp. 686–690, (Mar. 1980).

Keppner, H., et al., "The "Micromorph" Cell: A New Way to High–Efficiency–Low–Temperature Crystalline Silicon Thin–Film Cell Manufacturing", *Mat. Res. Soc. Symp. Proc., 452*, pp. 865–876, (1997).

Kiang, M., et al., "Pd/Si plasma immersion ion implantation for selective electrless copper plating on Sio2", *Appl. Phys. Lett., 60*, pp. 2767–2769, (1992).

Kistiakowsky, G.B., et al., "Reactions of Nitrogen Atoms. I. Oxygen and Oxides of Nitrogen", *The Journal of Chemical Physics, 27(5)*, pp. 1141–1149, (1957).

Laursen, T., et al., "Encapsulation of Copper by Nitridation on Cu–Ti Alloy/Bilayer Structures", *International Conference on Metallurgical Coatings and Thin Films*, Abstract No. H1.03, San Diego, CA, p. 309, (Apr. 1997).

Len, V., et al., "An investigation into the performance of diffusion barrier materials against copper diffusion using metal–oxide–semiconductor (MOS) capacitor structures", *Solid–State Electronics, 43*, pp. 1045–1049, (1999).

Lyman, T., et al., "Metallography, Structures and Phase Diagrams", *Metals Handbook, 8*, American Society for Metals, Metals Park, Ohio, pp. 300 & 302, (1989).

Marcadal, C., et al., "OMCVD Copper Process for Dual Damascene Metallization", *VMIC Conference*, ISMIC, pp. 93–97, (1997).

Miller, R.D., et al., "Low Dielectric Constant Polyimides and Polyimide Nanofoams", *Seventh Meeting of the DuPont Symposium on Polymides in Microelectronics*, pp. 443–473, (Sep. 1996).

Murarka, S.P., et al., "Copper Interconnection Schemes: Elimination of The Need of Diffusion Barrier/Adhesion Promoter by the Use of Corrosion Resistant, Low Resistivity Doped Copper", *SPIE, 2335*, pp. 80–90, (1994).

Nakao, S., et al., "Thin and Low–Resistivity Tantalum Nitride Diffusion Barrier and Giant–Grain Copper Interconnects for Advanced ULSI Metallization", *Japanese Journal of Applied Physics, 38 (4B)*, pp. 262–263, (Apr. 1999).

Newboe, B., et al., "Applied Materials Announces First Barrier/Seed Layer System For Copper Interconnects", *Applied Materials*, http:/www.appliedmaterials.com/newsroom/pr–00103.html, pp. 1–4, (1997).

Okamoto, Y., et al., "Magnetically Excited Plasma Oxynitridation of Si at Room Temperature", *Jpn. J. Appl. Phys., 34*, pp. L955–957, (1995).

Radzimski, Z.J., et al., "Directional Copper Deposition using d–c Magnetron Self–sputtering", *J. Vac. Sci. Technol. B, 16(3)*, pp. 1102–1106, (1998).

Rath, J.K., et al., "Low–Temperature deposition of poly-crystalline silicon thin films by hot–wire CVD", *Solar Energy Materials and Solar Cells, 48*, pp. 269–277, (1997).

Ray, S.K., et al., "Fluorine–enhanced nitridation of silicon at low temperatures in a microwave plasma", *J. Appl. Phys., 70(3)*, pp. 1874–1876, (1991).

Rossnagel, S.M., et al., "Metal ion deposition from ionized mangetron sputtering discharge", *J. Vac. Sci. Technol. B, 12(1)*, pp. 449–453, (1994).

Ryan, J.G., et al., "Copper Interconnects for Advanced Logic and DRAM", Extended Abstracts of the 1998 International Conference on Solid–State Devices and Materials, Hiroshima, pp. 258–259, (1998).

Ryu, C., et al., "Barriers for copper interconnections", *Solid State Technology*, pp. 53,54,56, (Apr. 1999).

Saarivirta, M.J., "High Conductivity Copper Rich Cu–Zr Alloys", *Transactions of the Metallurgical Society of AIME, 218*, pp. 431–437, (1960).

Senzaki, Y., "Chemical Vapor Deposition of Copper using a New Liquid Precursor with Improved Thermal Stability", *Conference Proceedings ULSI XIII, Materials Research Society*, pp. 451–455, (1998).

Shacham–Diamond, Y., et al., "Copper electroless deposition technology for ultra–large–scale–integration (ULSI) metallization", *Microelectronic Engineering, 33*, pp. 47–58, (1997).

Tsukada, T., et al., "Adhesion of copper films on ABS polymers deposited in an internal magnet magnetron sputtering system", *J. Vac. Sci. Technol., 16(2)*, pp. 348–351, (1979).

Venkatesan, S., et al., "A High Performance 1.8V, 0.20 micrometer CMOS Technology with Copper Metalization", *IEEE*, pp. 769–772, (1997).

Vossen, J.L., et al., *Thin Film Processes II*, Academic Press, Inc., 1–866, (1991).

Wang, K., et al., "Very Low Temperature Deposition of Polycrystalline Silicon Films with Micro–Meter–Order Grains on SiO2", *Mat. Res. Soc. Symp. Proc., 355*, pp. 581–586, (1995).

Winters, H.F., et al., "Influence of Surface Absorption Characteristics on Reactivity Sputtered Films Grown in the Biased and Unbiased Modes", *J. Appl. Phys. 43(3)*, pp. 794–799, (1972).

Yeh, J.L., et al., "Selective Copper plating of Polysilicon Surface Micromachined Structures", *Solid–State Sensor and Actuator Workshop*, pp. 248–251, (1998).

Zhang, J., et al., "Investigations of photo–induced decomposition of palladium acetate for electroless copper plating", *Thin Solid Films, 318*, pp. 234–238, (1998).

* cited by examiner

SELECTIVE ELECTROLESS-PLATED COPPER METALLIZATION

RELATED APPLICATIONS

This application is related to the following co-filed and commonly assigned applications; attorney docket number 303.618US1, entitled "Method and Apparatus for Making Integrated-Circuit Wiring from Copper, Silver, Gold, and Other Metals," Ser. No. 09/488,098 and attorney docket number 303.648US1, entitled "Method for Making Copper Interconnects in Integrated Circuits," Ser. No. 09/484,303 which are hereby incorporated by reference.

FIELD OF THE INVENTION

The present invention relates generally to integrated circuits. More particularly, it pertains to structures and methods for selective electroless-plated copper metallization.

BACKGROUND OF THE INVENTION

The rapid progress in miniaturization of integrated circuits (IC) is leading to denser and finer pitched chips with ever increasing performance. In order to enhance the performance of advanced ICs, the interconnect systems are gradually migrating from aluminum-based metallurgy to higher-conductivity and more electromigration-resistant copper. Of the several schemes proposed for fabricating copper interconnects, the most promising method appears to be the Damascene process. Using this method, the trenches and vias are patterned in blanket dielectrics, and then metal is deposited into the trenches and holes in one step, followed by chemical mechanical polishing (CMP) to remove the unwanted surface metal. This leaves the desired metal in the trenches and holes, and a planarized surface for subsequent metallization. During the CMP process, especially for the via holes, more than 99% of the deposited copper is removed, and this is a very wasteful and expensive process, which includes a high usage of consumables such as pads and slurry. Furthermore, the disposition of used materials is a very important environmental issue. Therefore it is highly desirable to accomplish the copper metallization without CMP.

One approach to the formation of copper vias and metal lines includes the electroless deposition of copper. Electroless deposition of copper is used in printed circuit boards to manufacture copper lines and through holes where the line and hole dimensions are in the several tens to hundreds of microns. The is, of course, much larger than the sub-micron design rules for integrated circuit fabrication on silicon wafers. In this approach, Palladium (Pd) is often used as the activated base metal for electroless copper plating. Several different groups have shown the success of the same. For example, an article published by Bhansali and D. K. Sood, entitled, "A novel technique for fabrication of metallic structure on polyimide by selective electroless copper plating using ion implantation," Thin Solid Films, vol. 270, p. 489–492, 1995, successfully used palladium ion implantation into polyimide to seed an electroless plated copper film on the polyimide surface. An ion dose range of $1.5 \times 10^{15}$ to $1.2 \times 10^{17}$ ions/cm$^2$ was used. They also reported on the successful use of copper implantation into silicon to seed the electroless plating using a dose range of $5 \times 10^{14}$ to $6.4 \times 10^{16}$ ions/cm$^2$. (See, Bhansali, S. et al, "Selective electroless copper plating on silicon seeded by copper ion implantation", Thin Solid Films, vol. 253, no. 1–2, p. 391–394, 1994). An article published by M.-H. Kiang, et al, entitled, "Pd/Si plasma immersion ion implantation for selective electroless copper plating on SiO$_2$, Applied Physics Letters, vol. 60, no. 22, p. 2767–2769, 1992, demonstrated selective deposition of copper in SiO$_2$ trenches using Pd/Si plasma immersion ion implantation and electroless copper plating. An article published by J.-Y. Zhang et al, entitled, "Investigations of photo-induced decomposition of palladium acetate for electroless copper plating", Thin Solid Films, vol. 318, p. 234–238, 1998, illustrates photo-induced palladium decomposition of acetate performed by using argon and xenon excimer vacuum ultraviolet sources in the formation of palladium, which acted as a catalyst for subsequent copper plating by means of an electroless bath for selective copper deposition. An article published by M.-H. Bernier et al, entitled, "Laser processing of palladium for selective electroless copper plating", SPIE Proc., vol. 2045, p. 330–337, 1993 demonstrated that the direct writing of palladium features by the Ar$^+$ laser-induced pyrolytic decomposition of an organometallic palladium resins on polyimide and Si$_3$N$_4$ led to active Pd sites which were selectively copper plated. Also, as described in an article published by J.-L. Yeh et al, entitled, "Selective Copper Plating of Polysilicon surface Micromachined Structures", Technical digest of 1998 Solid-State Sensor and Actuator Workshop, Transducer Research Foundation Catalog No. 98TRF-0001, p.248–251, 1998, Yeh et al. exposed polycrystalline silicon structures to a palladium solution that selectively activated the polysilicon structure, but not the silicon oxide or nitride layers. Upon immersion into a copper plating solution at a temperature between 55 and 80° C., the copper nuclei were initially formed on the Pd$^+$ activated polysilicon surface. After the formation of a thin-layer copper, copper started to deposit on this thin initiated copper film. Recently, an article published by V. M. Dubin et al, entitled, "Selective and Blanket Electroless Copper Deposition for Ultralarge Scale Integration", J. Electrochem. Soc., vol. 144, no. 3, p. 898–908, 1997, disclosed a novel seeding method for electroless copper deposition on sputtered copper films with an aluminum protection layer. This seeding method consisted of (I) deposition of Cu seed layer by sputtering or evaporation, (ii) deposition of a sacrificial thin aluminum layer without breaking vacuum, (iii) etching the aluminum layer in the electroless Cu plating bath, followed by electroless Cu deposition.

Here, Dubin et al. designed and constructed a single-wafer electroless copper deposition tool with up to 200 mm wafer capability, and an electroless copper deposition process was developed. Electroless Cu films deposited at high plating rate (up to 120 nm/min) in solutions with optimized plating chemical environment exhibited low resistivity (<2µ ohm cm for as deposited films), low surface roughness, and good electrical uniformity.

All of these above described methods are rather complex which means that the number of process steps involved in integrated circuit fabrication increases. The problem associated with these methods is that an increase in the number of process steps makes integrated circuit fabrication more costly. Further, none of the above described methods address or provide a resolution to the costly excess expenditure of materials and the environmental concerns when such processes are implemented to form sub-micron vias and metal lines on wafers in a conventional CMP fabrication process.

For the reasons stated above and for others which will become apparent from reading the following disclosure, structures and methods are needed which alleviate the problems associated with via and metal line fabrication processes. These structures and methods for via and metal line fabrication must be streamlined and accommodate the demand for higher performance in integrated circuits even as the fabrication design rules shrink.

SUMMARY OF THE INVENTION

The above mentioned problems associated with integrated circuit size and performance, the via and metal line formation process, and other problems are addressed by the present invention and will be understood by reading and studying the following specification. Structures and methods are provided which include a selective electroless copper metallization. The present invention provides for a multilayer copper wiring structure by electroless, selectively deposited copper in a streamlined process which will not require chemical mechanical planarization (CMP). Thus, the present invention significantly reduces the amount of deposited conductive material, e.g. copper, which is ultimately discarded according to conventional processes. This alleviates important environmental concerns regarding the disposition of used materials. Further, by avoiding the need for a CMP process step, the usage of consumables such as pads and slurry is conserved.

In particular, an illustrative embodiment of the present invention includes a novel methodology for forming copper vias on a substrate. This method includes depositing a thin film seed layer of Palladium (Pd) or Copper (Cu) on a substrate. The seed layer is deposited to a thickness of less than 15 nanometers (nm). A photolithography technique is used to define a number of via holes above the seed layer. In one embodiment, using a photolithography technique includes forming a patterned photoresist layer to define the number of via holes above the seed layer. A layer of copper is deposited over the seed layer using electroless plating filling the number of via holes to a top surface of the patterned photoresist layer. The method can be repeated any number of times depositing a second seed layer, depositing another patterned photoresist layer defining a number of conductor line openings above the second seed layer, and forming a second layer of copper using electroless plating which fills the number of conductor line openings to a top surface of the second patterned photoresist layer. The photoresist layers along with the seed layers in other regions can then be removed by ashing and a chemical mechanical planarization process is avoided. Structures formed by this novel process are similarly included within the scope of the present invention.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Substrate include doped and unhoped semiconductors, epitaxial semiconductor layers supported by a base semiconductor or insulator, as well as other semiconductor structures well known to one skilled in the art. The term insulator is defined to include any material that is less electrically conductive than the materials generally referred to as conductors by those skilled in the art. The following detailed description is, therefore, not to be taken in a limiting sense.

Figures 1A, 1B:
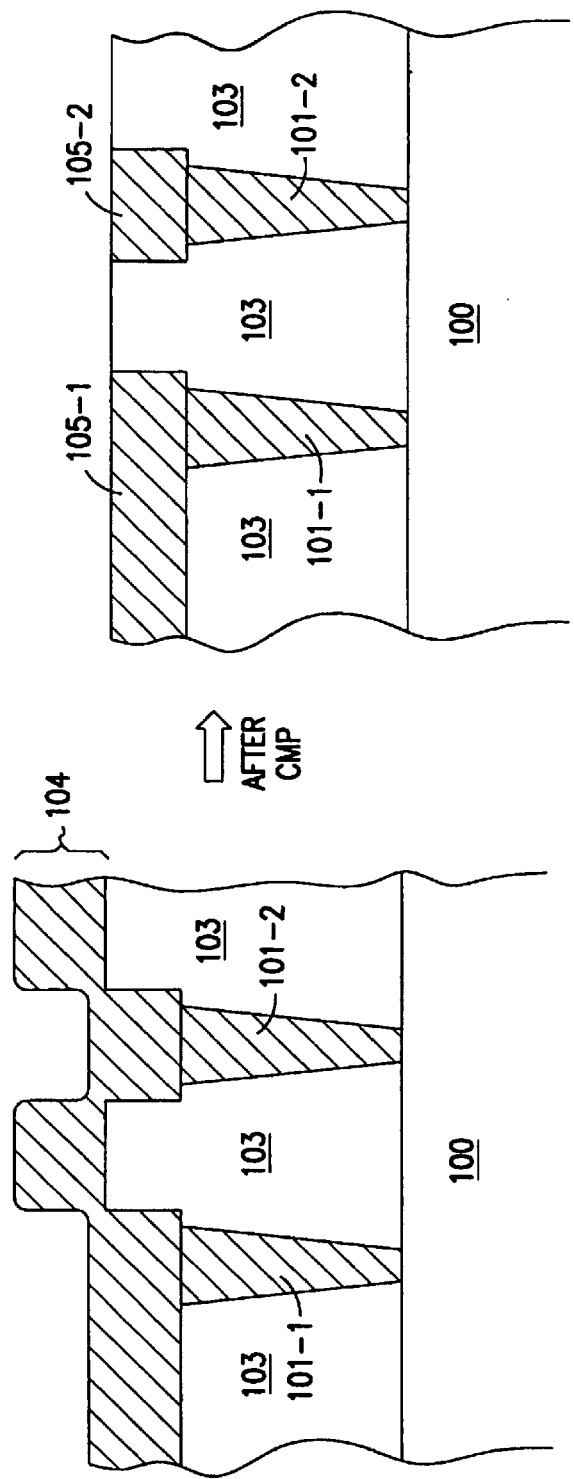
FIGS. 1A–1B illustrate an embodiment of the various processing steps for forming vias and metal lines according to the teachings of the prior art.

FIGS. 1A–1B illustrate an embodiment of the various processing steps for forming vias and metal lines according to the teachings of the prior art. As shown in FIG. 1A, a number of vias 101-1 and 101-2 are formed in an insulator material 103, e.g. silicon dioxide ($SiO_2$), contacting with a substrate 100. As one of ordinary skill in the art will recognize, any number of semiconductor devices can be formed in the substrate to which the number of vias 101-1 and 101-2 make electrical contact.

Conventionally, to form vias and aluminum wire metal lines, fabricators use a dual-damascene metallization technique, which takes its name from the ancient Damascene metalworking art of inlaying metal in grooves or channels to form ornamental patterns. The dual-damascene technique entails covering the components on a wafer with an insulative layer 103, etching small holes in the insulative layer 103 to expose portions of the components underneath in substrate 100, and subsequently etching shallow trenches from hole to hole to define a number of metal lines. Fabricators then blanket the entire insulative layer with a layer of aluminum or other conductive material and polish off the excess, leaving behind conductive vias, or contact plugs, in the holes and conductive lines in the trenches.

As shown in the prior art of FIG. 1A, a layer of copper 104 can be deposited in the holes and trenches using an electroplated copper deposition technique. As shown in FIG. 1A, the copper layer 104 fills the holes and the trenches, but also covers all of the surfaces features such the insulator material 103 used in the dual damascene process.

FIG. 1B illustrates the structure after the excess copper has been removed through a chemically mechanical planarization (CMP) process step. As shown in the prior art FIG. 1B, the CMP process step polishes the deposited layer of copper 104 down to and level with the top surface of the insulator layer 103 to form the copper vias 101-1 and 101-2 as well as copper metal lines 105-1 and 105-2. One of ordinary skill in the art will understand, upon viewing the fabrication process illustrated in FIGS. 1A and 1B, the wastefulness in the amount of copper which is discarded in the CMP process step.

METHOD OF THE PRESENT INVENTION

Figure 2A:
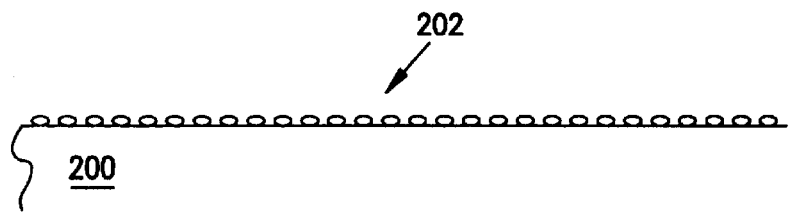
FIGS. 2A–2K illustrate an embodiment of the various processing steps for a selective electroless-plated copper metallization according to the teachings of the present invention.

FIGS. 2A through 2K illustrate a novel methodology for a selective electroless-plated copper metallization according to the teachings of the present invention. Specifically, FIGS. 2A through 2K illustrate a method for forming a multilayer copper (Cu) wiring structure on a substrate. The methodology of the present invention avoids the need for a chemical mechanical planarization (CMP) process step in forming the same. As shown in FIG. 2A, a seed layer, or first seed layer, 202 is deposited on a substrate 200. In one embodiment, depositing the first seed layer 202 on the substrate 200 includes depositing a thin film of Palladium (Pd) on the substrate 200. In another embodiment, depositing the first seed layer 202 on the substrate 200 includes depositing a thin film of Copper (Cu) on the substrate. The seed layer 202 is deposited to have a thickness of less than 15 nanometers (nm). In one exemplary embodiment, the seed layer 202 is deposited to form a barely continuous film in the thickness range of 3 to 10 nm. In another exemplary embodiment, the seed layer 202 is deposited such that the seed layer possesses a discontinuous island structure in the thickness range of 3 to 10 nm. In one embodiment, the seed layer 202 is deposited using a physical vapor deposition process. For example, in one embodiment, the seed layer 202 is deposited using a sputtering deposition technique. In another embodiment, the seed layer 202 is deposited using an evaporation deposition technique. One of ordinary skill in the art will understand, upon reading this disclosure, the manner in which such physical vapor deposition processes can be performed to form the seed layer 202 described herein.

Figure 2B:
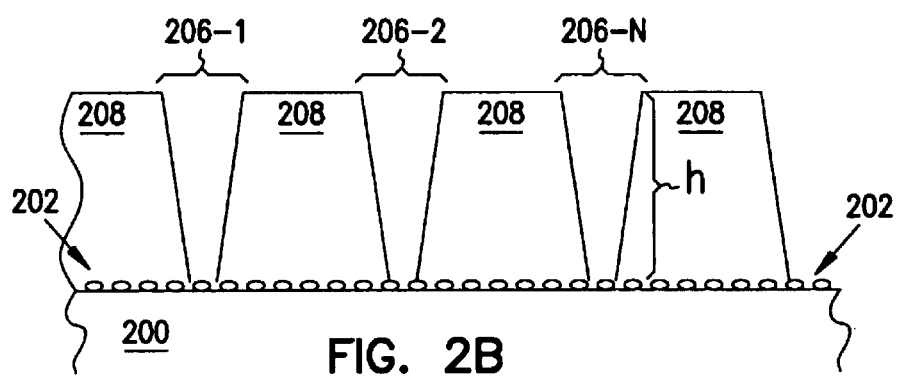

FIG. 2B illustrates the structure following the next sequence of processing steps. In FIG. 2B, a photolithography technique is used to define a number of via holes, or openings, 206-1, 206-2, . . . , 206-N, above the seed layer 202 on the substrate 200. As one of ordinary skill in the art will understand upon reading this disclosure, using a photolithography technique to define a number of holes 206-1, 206-2, . . . , 206-N, includes patterning a photoresist layer 208 to define the number via holes, or openings, 206-1, 206-2, . . . , 206-N over the seed layer 202. One of ordinary skill in the art will also understand upon reading this disclosure, the manner of forming the patterned photoresist layer, or first patterned photoresist layer, 208. For example, a photoresist layer can be deposited over the seed layer 202 using any suitable technique, e.g. by spin coating. Then the photoresist can be masked, exposed, and washed to define the number of via holes, or openings, 206-1, 206-2, . . . , 206-N to the seed layer 202. One of ordinary skill in the art will further understand, upon reading this disclosure, that the thickness of the photoresist layer 202 is scalable. That is, the deposition of the photoresist layer 208 is controllable such that the photoresist thickness can be set at a predetermined height (h1). Thus, the scalable thickness of the photoresist layer 208 determines a height (h1), or depth (h1) for the number of via holes, or openings, 206-1, 206-2, . . . , 206-N. The structure is now as appears in FIG. 2B.

Figure 2C:
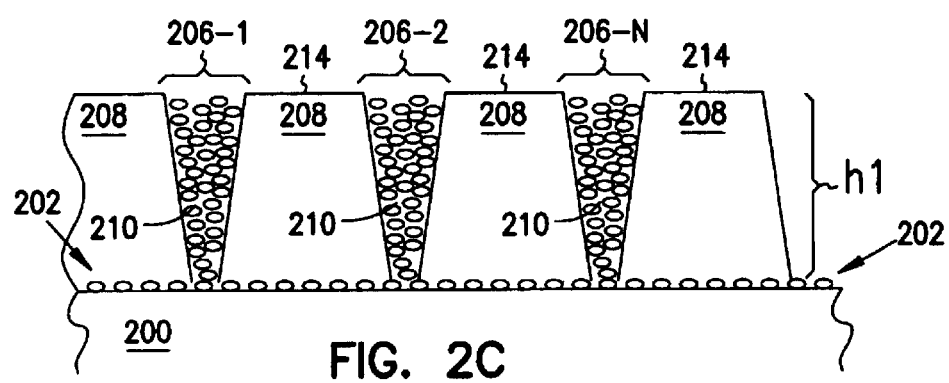

FIG. 2C illustrates the structure following the next sequence of processing steps. In FIG. 2C, a layer of copper, first layer of copper, or first level of copper vias 210 is deposited over the seed layer 202 using electroless plating. One of ordinary skill in the art will understand upon reading this disclosure the various manner in which the layer of copper, first layer of copper, or first level of copper vias 210 can be deposited over the seed layer 202 using electroless plating. According to the teachings of the present invention, the layer of copper, first layer of copper, or first level of copper vias 210 is formed in the number of via holes, or openings, 206-1, 206-2, . . . , 206-N. Forming layer of copper, first layer of copper, or first level of copper vias 210 includes filling the number of via holes, or openings, 206-1, 206-2, . . . , 206-N to a top surface 214 of the first patterned photoresist layer 208. According to the teachings of the present invention depositing the layer of copper, first layer of copper, or first level of copper vias 210 over the seed layer 202 is such that the layer of copper, first layer of copper, or first level of copper vias 210 form on the seed layer 202 but not on the patterned photoresist layer 208. The structure is now as appears in FIG. 2C.

Figure 2D:
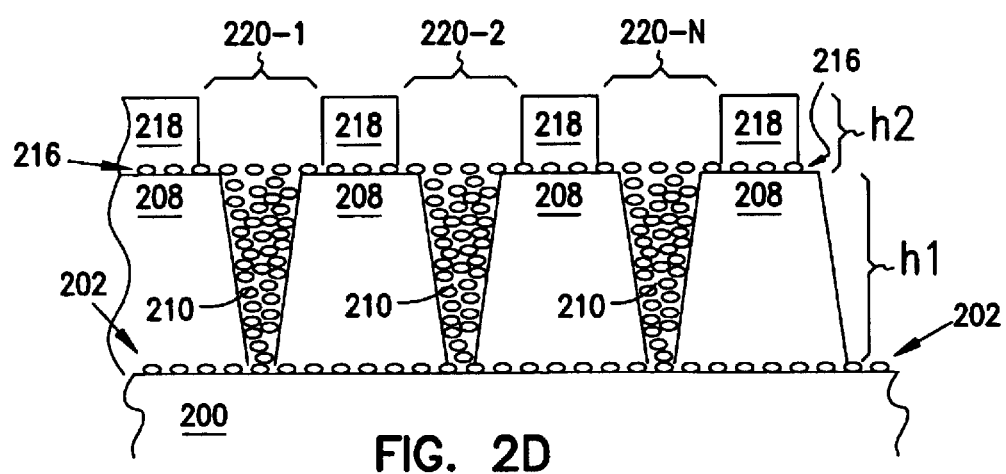

FIG. 2D illustrates the structure following the next sequence of processing steps. In FIG. 2D, another seed layer, or second seed layer, 216 is deposited on the first layer of copper, or first level of copper vias 210 and the top surface 214 of the first patterned photoresist layer 208. In one embodiment, depositing the second seed layer 216 on the first layer of copper, or first level of copper vias 210 and the top surface 214 of the first patterned photoresist layer 208 includes depositing a thin film of Palladium (Pd). In another embodiment, depositing the second seed layer 216 on the first layer of copper, or first level of copper vias 210 and the top surface 214 of the first patterned photoresist layer 208 includes depositing a thin film of Copper (Cu). As before, the second seed layer 216 is deposited to have a thickness of less than 15 nanometers (nm). In one exemplary embodiment, the second seed layer 216 is deposited to form a barely continuous film in the thickness range of 3 to 10 nm. In another exemplary embodiment, the second seed layer 216 is deposited such that the second seed layer 216 possesses a discontinuous island structure 216 having an island thickness in the range of 3 to 10 nm.

In one embodiment, the second seed layer 216 is deposited using a physical vapor deposition process. For example, in one embodiment, the second seed layer 216 is deposited using a sputtering deposition technique. In another embodiment, the second seed layer 216 is deposited using an evaporation deposition technique. One of ordinary skill in the art will understand, upon reading this disclosure, the manner in which such physical vapor deposition processes can be performed to form the second seed layer 216 described herein.

A second patterned photoresist layer 218 is deposited above the second seed layer 216, which defines a number of conductor line openings 220-1, 220-2, . . . , 220-N. In one embodiment, depositing the second patterned photoresist layer 218 which defines a number of conductor line openings 220-1, 220-2, . . . , 220-N, or first level metal line openings 220-1, 220-2, . . . , 220-N. In one embodiment, the number of conductor line openings 220-1, 220-2, . . . , 220-N are defined to form a number of conductor line openings 220-1, 220-2, . . . , 220-N having a near minimum width and spacing. As one of ordinary skill in the art will understand upon reading this disclosure, this insures a sufficient space in the structure for a subsequent removal of the photoresist layers, e.g. first patterned photoresist layer 208, on lower levels. This consideration is described in greater detail in a co-pending, co-filed application, client docket #99-0673 entitled, "A Multilevel Copper Interconnect with Double Insulation for ULSI." One of ordinary skill in the art will understand upon reading this disclosure, the manner of forming the second patterned photoresist layer 218. For example, a photoresist layer can be deposited over the second seed layer 216 using any suitable technique, e.g. by spin coating. Then the photoresist can be masked, exposed, and washed to define the number of conductor line openings 220-1, 220-2, . . . , 220-N to the second seed layer 216. One of ordinary skill in the art will further understand, upon reading this disclosure, that the thickness of the second patterned photoresist layer 218 is scalable. That is, the deposition of the photoresist layer 218 is controllable such that the photoresist thickness can be set at a predetermined height (h2). Thus, the scalable thickness of the second patterned photoresist layer 218 determines a height (h2), or depth (h2) for the number of conductor line openings 220-1, 220-2, . . . , 220-N. According to the teachings of the present invention, depositing the second patterned photoresist layer 218 includes depositing the second patterned photoresist layer 218 to have a thickness (h2) which is less than a thickness (h1) of the first patterned photoresist layer 208. That is, the thickness (h2) of the second patterned photoresist layer 218, and consequently a depth (h2) of the number of conductor line openings 220-1, 220-2, . . . , 220-N, is thinner than a depth (h1) of the first level of copper vias 210 defined by the thickness (h1) of the first patterned photoresist layer 208. The structure is now as appears in FIG. 2D.

Figure 2E:
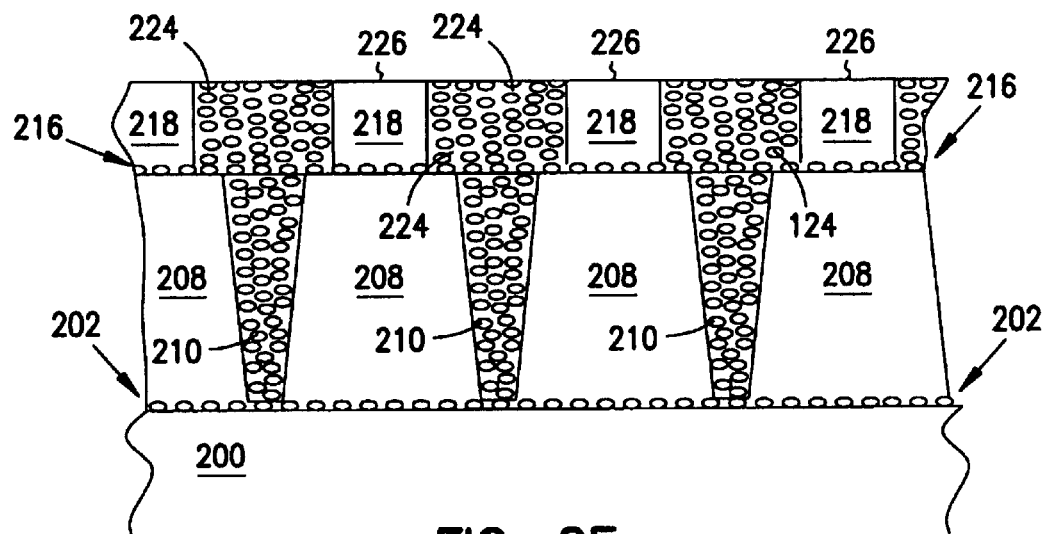

FIG. 2E illustrates the structure following the next sequence of processing steps. In FIG. 2E, another layer of copper, second layer of copper, or first level of conductor lines 224 is deposited or formed in the number of conductor line openings 220-1, 220-2, . . . , 220-N using electroless plating. One of ordinary skill in the art will understand upon reading this disclosure the various manner in which this next layer of copper, second layer of copper, or first level of conductor lines 224 can be deposited in the number of conductor line openings 220-1, 220-2, . . . , 220-N using electroless plating. According to the teachings of the present invention, forming this next layer of copper, second layer of copper, or first level of conductor lines 224 includes filling the number of conductor line openings 220-1, 220-2, . . . , 220-N to a top surface 226 of the second patterned photoresist layer 218. According to the teachings of the present invention depositing this next layer of copper, second layer of copper, or first level of conductor lines 224 over the second seed layer 216 is such that this next layer of copper, second layer of copper, or first level of conductor lines 224 form on the second seed layer 216 but not on the second patterned photoresist layer 218. The structure is now as appears in FIG. 2E.

Figure 2F:
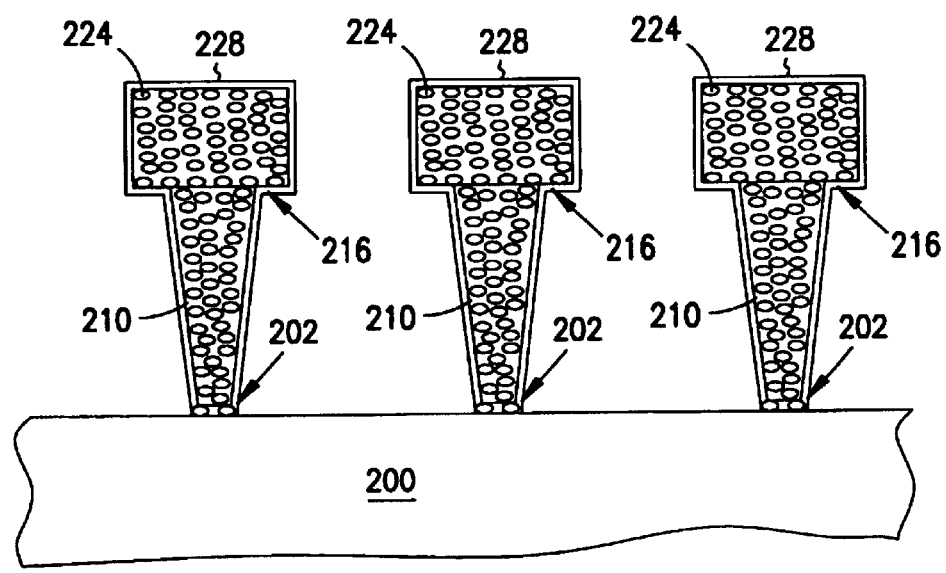

FIG. 2F illustrates the structure after the following sequence of processing steps. In FIG. 2F, according to the teachings of the present invention, the first patterned photoresist layer 208 and the second patterned photoresist layer 218 are removed. In one exemplary embodiment, removing the first patterned photoresist layer 208 and the second patterned photoresist layer 218 includes removing the first patterned photoresist layer 208 and the second patterned photoresist layer 218 using an oxygen plasma etching. According to the teachings of the present invention, the method further includes removing the first and second seed layers 202 and 216 with the photoresist layers 208 and 218 from areas on the substrate 200 which are not beneath the number of copper vias 210 or between the conductive metal lines 224 and the vias 210. As one of ordinary skill in the art will understand from reading this disclosure, this is due the present inventions novel methodology where the seed layers, 202 and 216, are deposited to have a thickness of less than 15 nanometers (nm), thus forming a barely continuous thin film and/or discontinuous island structure. Other suitable techniques for removing the first patterned photoresist layer 208 and the second patterned photoresist layer 218 can similarly be employed.

At this point, a thin diffusion barrier 228 can be formed on the exposed first level of copper vias 210 and first level of conductor lines 224 as well as the remaining, exposed first and second seed layers, 202 and 216 respectively, located between the substrate, vias, and metal lines. According to the teachings of the present invention, forming a thin diffusion barrier 228 includes forming a thin diffusion barrier of Tungsten Silicon Nitride ($WSi_xN_y$) 228 having a thickness of less than 8 nanometers (nm). In one embodiment, according to the teachings of the present invention, forming a thin diffusion barrier of Tungsten Silicon Nitride ($WSi_xN_y$) 228 having a thickness of less than 8 nanometers (nm) includes forming a graded composition of $WSi_x$, where x varies from 2.0 to 2.5, and nitriding the graded composition of $WSi_x$. The details of forming a thin diffusion barrier 228, as presented above, are further described in detail in a co-filed, co-pending application; attorney docket #303.648US1, entitled, "Method for Making Copper Interconnects in Integrated Circuits," which is hereby incorporated by reference. The structure is now as appears in FIG. 2F.

As one of ordinary skill in the art will understand upon reading this disclosure, forming additional or subsequent layer/levels of conductive vias and metallization lines are also included within the scope of the present invention. In this scenario, the removal of the first patterned photoresist layer 208 and the second patterned photoresist layer 218 can be delayed until these subsequent layer are completed, the invention is not so limited. That is, if subsequent layers are to be fabricated, the steps illustrated in FIG. 2F will be delayed and the process will repeat the sequence provided in FIGS. 2A–2E.

Figure 2G:
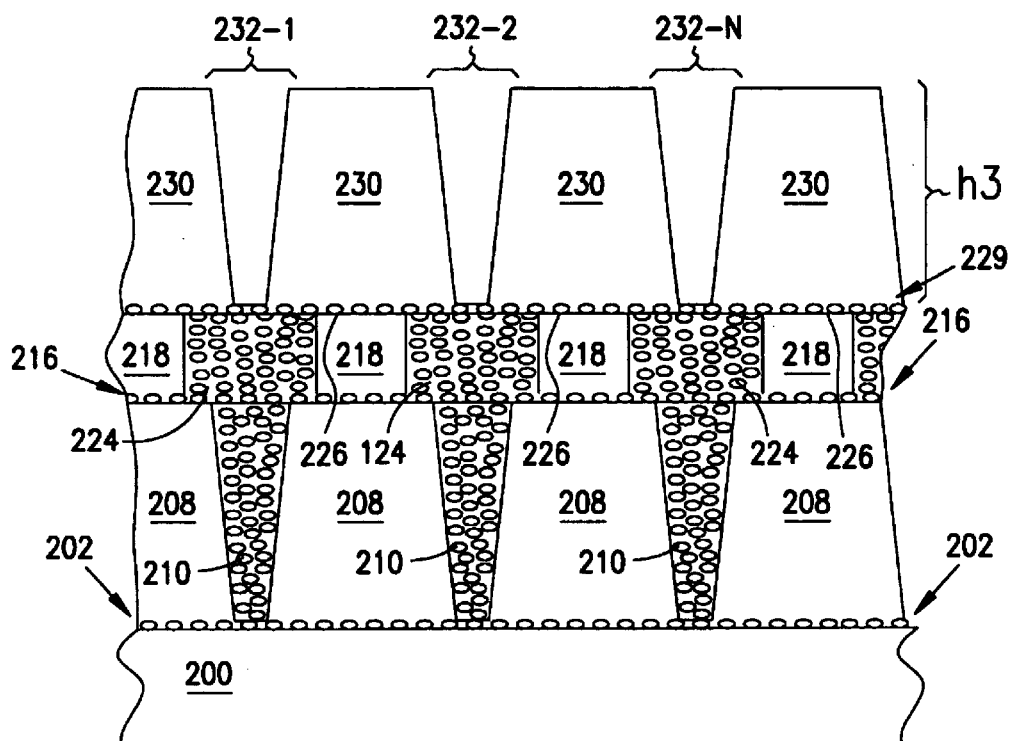

FIG. 2G illustrates the forming of subsequent via and metallization layers prior to the process steps of FIG. 2F and continuing in sequence after the number of process steps completed in FIG. 2E. For example, FIG. 2G shows that in forming subsequent conductive via and metallization layers, another seed layer, or third seed layer, 229 is deposited on the second layer of copper, or first level of conductor lines 224 and the top surface 226 of the second patterned photoresist layer 218. In one embodiment, depositing the third seed layer 229 on the second layer of copper, or first level of conductor lines 224 and the top surface 226 of the second patterned photoresist layer 218 includes depositing a thin film of Palladium (Pd). In another embodiment, depositing the third seed layer 229 on the second layer of copper, or first level of conductor lines 224 and the top surface 226 of the second patterned photoresist layer 218 includes depositing a thin film of Copper (Cu). As before, the third seed layer 229 is deposited to have a thickness of less than 15 nanometers (nm). In one exemplary embodiment, the third seed layer 229 is deposited to form a barely continuous film in the thickness range of 3 to 10 nm. In another exemplary embodiment, the third seed layer 229 is deposited such that the third seed layer 229 possesses a discontinuous island structure 229 having an island thickness in the range of 3 to 10 nm.

In one embodiment, the third seed layer 229 is deposited using a physical vapor deposition process. For example, in one embodiment, the third seed layer 229 is deposited using a sputtering deposition technique. In another embodiment, the third seed layer 229 is deposited using an evaporation deposition technique. One of ordinary skill in the art will understand, upon reading this disclosure, the manner in which such physical vapor deposition processes can be performed to form the third seed layer 229 described herein.

In FIG. 2G, a third patterned photoresist layer 230 is deposited above the third seed layer 229, which defines a number of via holes, or openings, 232-1, 232-2, ..., 232-N to the third seed layer 229. One of ordinary skill in the art will understand upon reading this disclosure, the manner of forming the third patterned photoresist layer 230. For example, a photoresist layer can be deposited over the third seed layer 229 using any suitable technique, e.g. by spin coating. Then the photoresist can be masked, exposed, and washed to define the number of via holes, or openings, 232-1, 232-2, ..., 232-N to the third seed layer 229. One of ordinary skill in the art will further understand, upon reading this disclosure, that the thickness of the second patterned photoresist layer 218 is scalable. That is, the deposition of the photoresist layer 230 is controllable such that the photoresist thickness can be set at a predetermined height (h3). Thus, the scalable thickness of the second patterned photoresist layer 230 determines a height (h3) for the number of via holes, or openings, 232-1, 232-2, ..., 232-N. The structure is now as appears in FIG. 2G.

Figure 2H:
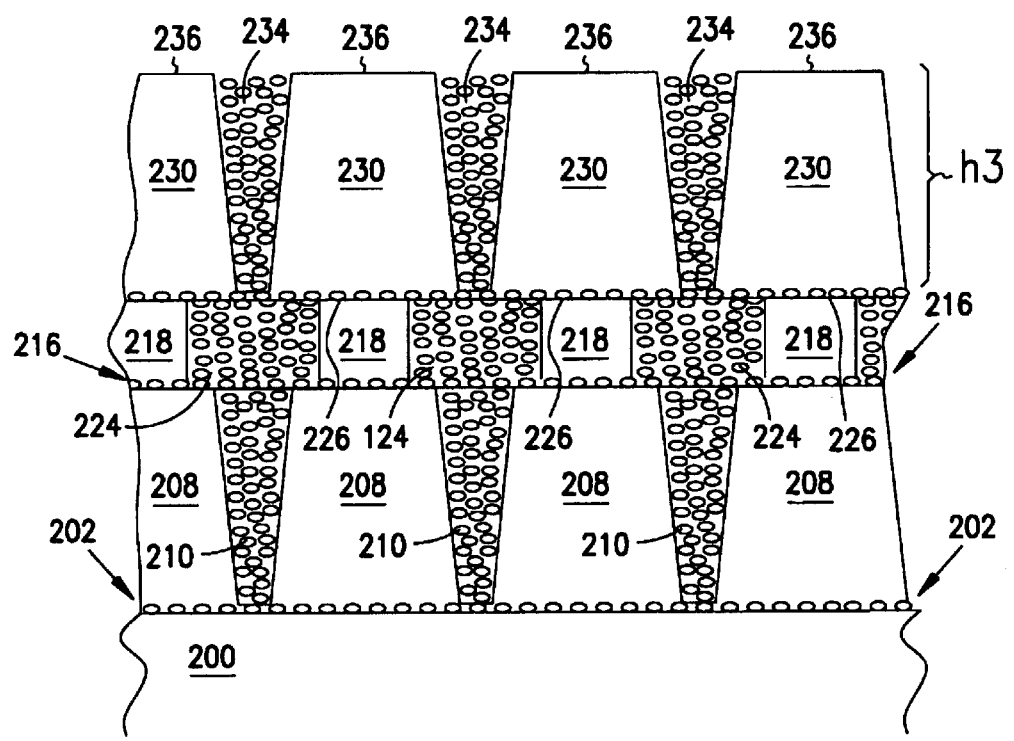

FIG. 2H illustrates the structure continuing on from the process steps included in FIG. 2G. In FIG. 2H, another layer of copper, third layer of copper, or second level of copper vias 234 is deposited or formed over the third seed layer 229 using electroless plating. One of ordinary skill in the art will understand upon reading this disclosure the various manner in which the third layer of copper, or second level of copper vias 234 can be deposited over the third seed layer 229 using electroless plating. According to the teachings of the present invention, the third layer of copper, or second level of copper vias 234 is formed in the number of via holes, or openings, 232-1, 232-2, ..., 232-N to the third seed layer 229. Forming the third layer of copper, or second level of copper vias 234 includes filling the number of via holes, or openings, 232-1, 232-2, ..., 232-N to a top surface 236 of the third patterned photoresist layer 230. According to the teachings of the present invention, depositing third layer of copper, or second level of copper vias 234 over the third seed layer 229 is such that the third layer of copper, or second level of copper vias 234 form on the third seed layer 229 but not on the third patterned photoresist layer 230. The structure is now as appears in FIG. 2H.

Figure 2I:
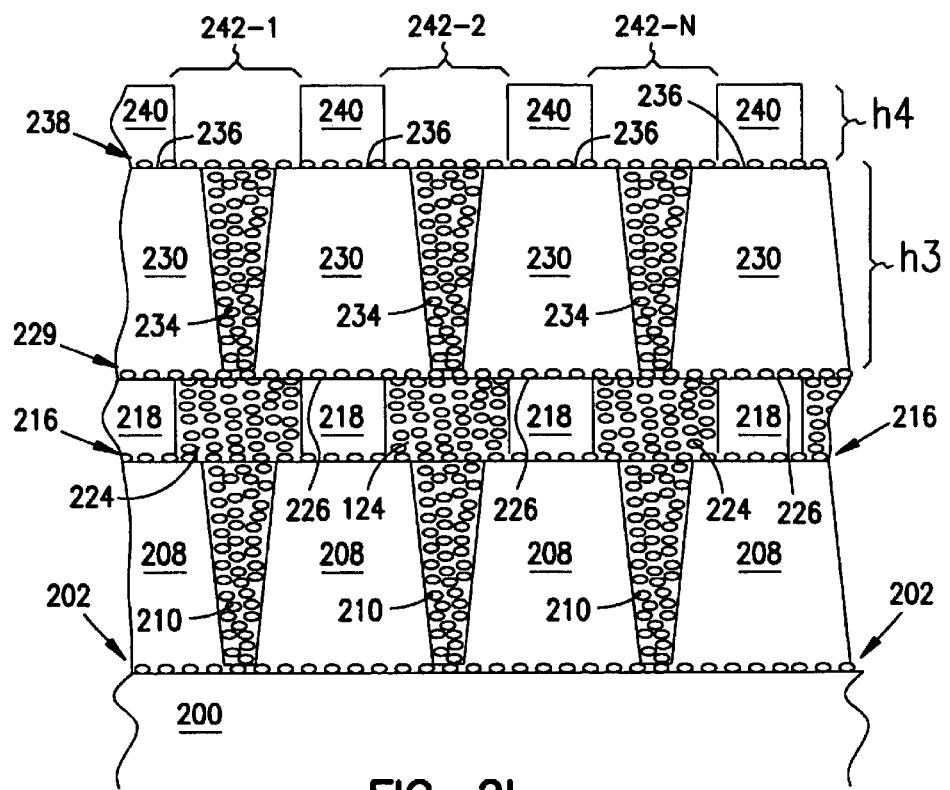

FIG. 2I illustrates the structure following the next sequence of processing steps. In FIG. 2I, another seed layer, or fourth seed layer, 238 is deposited on the third layer of copper, or second level of copper vias 234 and the top surface 236 of the third patterned photoresist layer 230. In one embodiment, depositing the fourth seed layer 238 on the third layer of copper, or second level of copper vias 234 and the top surface 236 of the third patterned photoresist layer 230 includes depositing a thin film of Palladium (Pd). In another embodiment, depositing the fourth seed layer 238 on the third layer of copper, or second level of copper vias 234 and the top surface 236 of the third patterned photoresist layer 230 includes depositing a thin film of Copper (Cu). As before, the fourth seed layer 238 is deposited to have a thickness of less than 10 nanometers (nm). In one exemplary embodiment, the fourth seed layer 238 is deposited to form a barely continuous film in the thickness range of 3 to 10 nm. In another exemplary embodiment, the fourth seed layer 238 is deposited such that the fourth seed layer 238 possesses a discontinuous island structure 238 having an island thickness in the range of 3 to 10 nm.

In one embodiment, the fourth seed layer 238 is deposited using a physical vapor deposition process. For example, in one embodiment, the fourth seed layer 238 is deposited using a sputtering deposition technique. In another embodiment, the fourth seed layer 238 is deposited using an evaporation deposition technique. One of ordinary skill in the art will understand, upon reading this disclosure, the manner in which such physical vapor deposition processes can be performed to form the fourth seed layer 238 described herein.

A fourth patterned photoresist layer 240 is deposited above the fourth seed layer 238, which defines a number of conductor line openings 242-1, 242-2, ..., 242-N. In one embodiment, depositing the fourth patterned photoresist layer 240 which defines a number of conductor line openings 242-1, 242-2, ..., 242-N includes defining a number of second level metal line openings 242-1, 242-2, ..., 242-N. In one embodiment, the second number of conductor line openings 242-1, 242-2, ..., 242-N are defined to form a number of conductor line openings 242-1, 242-2, ..., 242-N having a near minimum width and spacing. As one of ordinary skill in the art will understand upon reading this disclosure, this insures a sufficient space in the structure for a subsequent removal of the photoresist layers, e.g. first, second, and third patterned photoresist layer 208, 218, and 230 on lower levels. This consideration is described in greater detail in a co-pending, co-filed application, client docket #99-0673 entitled, "A Multilevel Copper Interconnect with Double Insulation for ULSI." One of ordinary skill in the art will understand upon reading this disclosure, the manner of forming the fourth patterned photoresist layer 240. For example, a photoresist layer can be deposited over the fourth seed layer 238 using any suitable technique, e.g. by spin coating. Then the photoresist can be masked, exposed, and washed to define the number of conductor line openings 242-1, 242-2, ..., 242-N to the fourth seed layer 238. One of ordinary skill in the art will further understand, upon reading this disclosure, that the thickness of the fourth patterned photoresist layer 240 is scalable. That is, the deposition of the fourth patterned photoresist layer 240 is controllable such that the photoresist thickness can be set at a predetermined height (h4). Thus, the scalable thickness of the fourth patterned photoresist layer 240 determines a height (h4) for the number of conductor line openings 242-1, 242-2, ..., 242-N. According to the teachings of the present invention, depositing the fourth patterned photoresist layer 240 includes depositing the fourth patterned photoresist layer 240 to have a thickness (h4) which is less than a thickness (h3) of the third patterned photoresist layer 230. That is, the thickness (h3) of the third patterned photoresist layer 230 is thinner than a depth (h3) of the second level of copper vias 234 defined by the thickness (h3) of the third patterned photoresist layer 230. The structure is now as appears in FIG. 2I.

Figure 2J:
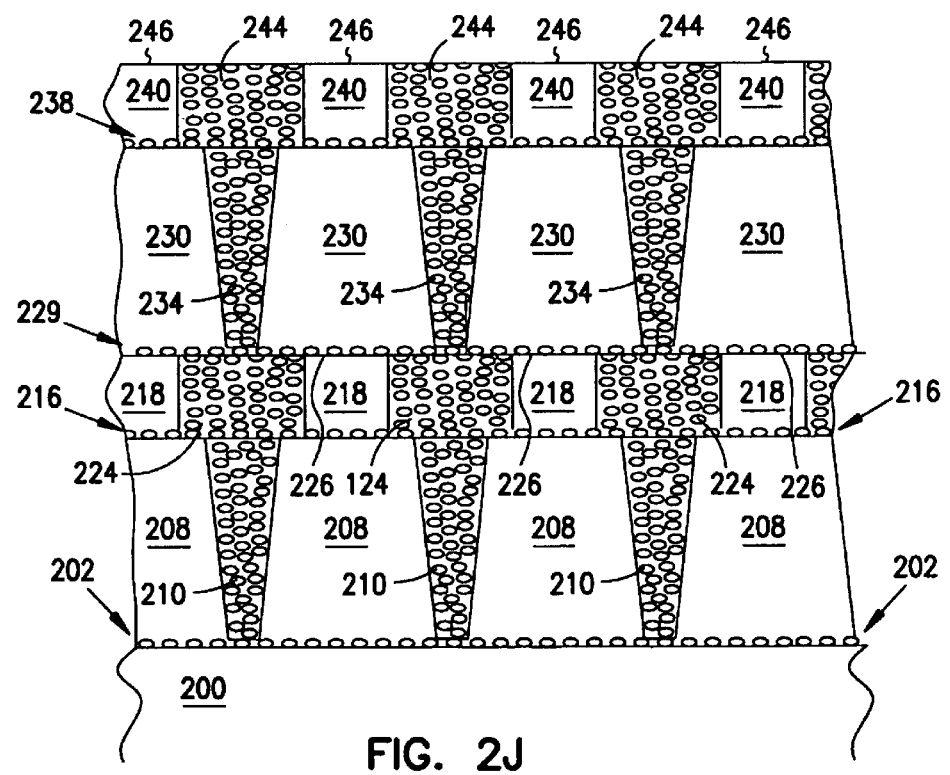

FIG. 2J illustrates the structure following the next sequence of processing steps. In FIG. 2E, another layer of copper, fourth layer of copper, or second level of conductor lines 244 is deposited or formed in the number of conductor line openings 242-1, 242-2, ..., 242-N using electroless plating. One of ordinary skill in the art will understand upon reading this disclosure the various manner in which this fourth layer of copper, or second level of conductor lines 244 can be deposited in the number of conductor line openings 242-1, 242-2, ..., 242-N using electroless plating. According to the teachings of the present invention, forming this fourth layer of copper, or second level of conductor lines 244 includes filling the number of conductor line openings 242-1, 242-2, ..., 242-N to a top surface 246 of the fourth patterned photoresist layer 240. According to the teachings of the present invention depositing this fourth layer of copper, or second level of conductor lines 244 over the fourth seed layer 238 is such that this fourth layer of copper, or second level of conductor lines 244 form on the fourth seed layer 238 but not on the fourth patterned photoresist layer 240. The structure is now as appears in FIG. 2J.

Figure 2K:
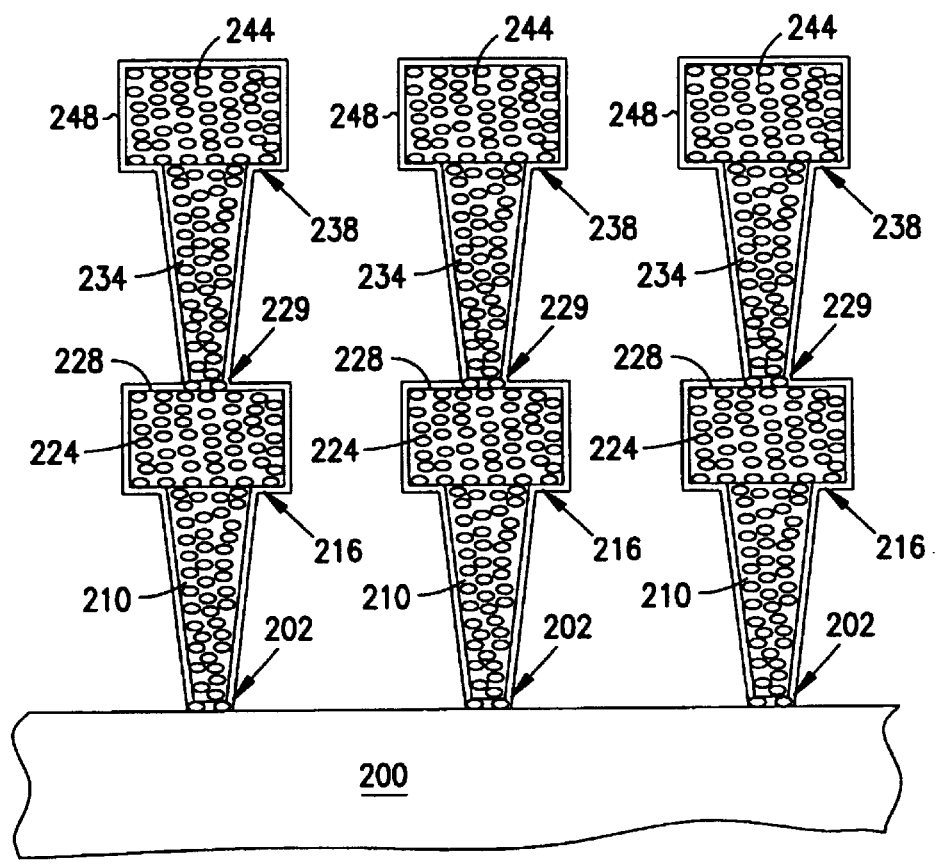

FIG. 2K illustrates the structure after the following sequence of processing steps. In FIG. 2K, according to the teachings of the present invention, the first, second, third, and fourth patterned photoresist layers 208, 218, 230, and 240 are removed. In one exemplary embodiment, removing the first, second, third, and fourth patterned photoresist layers 208, 218, 230, and 240 includes removing the first, second, third, and fourth patterned photoresist layers 208, 218, 230, and 240 using an oxygen plasma etching. According to the teachings of the present invention, the method further includes removing the first, second, third, and fourth seed layers, 202, 216, 229 and 238 respectively, with the photoresist layers from areas on the substrate which are not beneath the number of copper vias or between the conductive metal lines and the vias. As one of ordinary skill in the art will understand from reading this disclosure, this is due the present inventions novel methodology where the seed layers, 202, 216, 229 and 238, are deposited to have a thickness of less than 15 nanometers (nm), thus forming a barely continuous thin film and/or discontinuous island structure. Other suitable techniques for removing the first, second, third, and fourth patterned photoresist layers 208, 218, 230, and 240 can similarly be employed. As one of ordinary skill in the art will further understand upon reading this disclosure, the first, second, third, and fourth patterned photoresist layers 208, 218, 230, and 240 can be removed at earlier or later stages of a fabrication process, as described herein, depending on the number of via and metal levels to be formed.

At this point, or as could equally be performed at an earlier or later stage depending on when the photoresist layers are removed, a thin diffusion barrier 248 can be formed on the exposed first and second level of copper vias 210, 234 and the exposed first and second level of conductor lines 224, 244 as well as the remaining, exposed first, second, third, and fourth seed layers, 202, 216, 229 and 238 respectively, located between the substrate, vias, and metal lines. According to the teachings of the present invention, forming a thin diffusion barrier 248 includes forming a thin diffusion barrier of Tungsten Silicon Nitride (WSi$_x$N$_y$) 248 having a thickness of less than 8 nanometers (nm). In one embodiment, according to the teachings of the present invention, forming a thin diffusion barrier of Tungsten Silicon Nitride (WSi$_x$N$_y$) 248 having a thickness of less than 8 nanometers (nm) includes forming a graded composition of WSi$_x$, where x varies from 2.0 to 2.5, and nitriding the graded composition of WSi$_x$. The details of forming a thin diffusion barrier 228, as presented above, are further described in detail in a co-filed, copending application; attorney docket #303.648US1, entitled, "Method for Making Copper Interconnects in Integrated Circuits," which is hereby incorporated by reference. The structure is now as appears in FIG. 2K.

STRUCTURE

Figure 3:
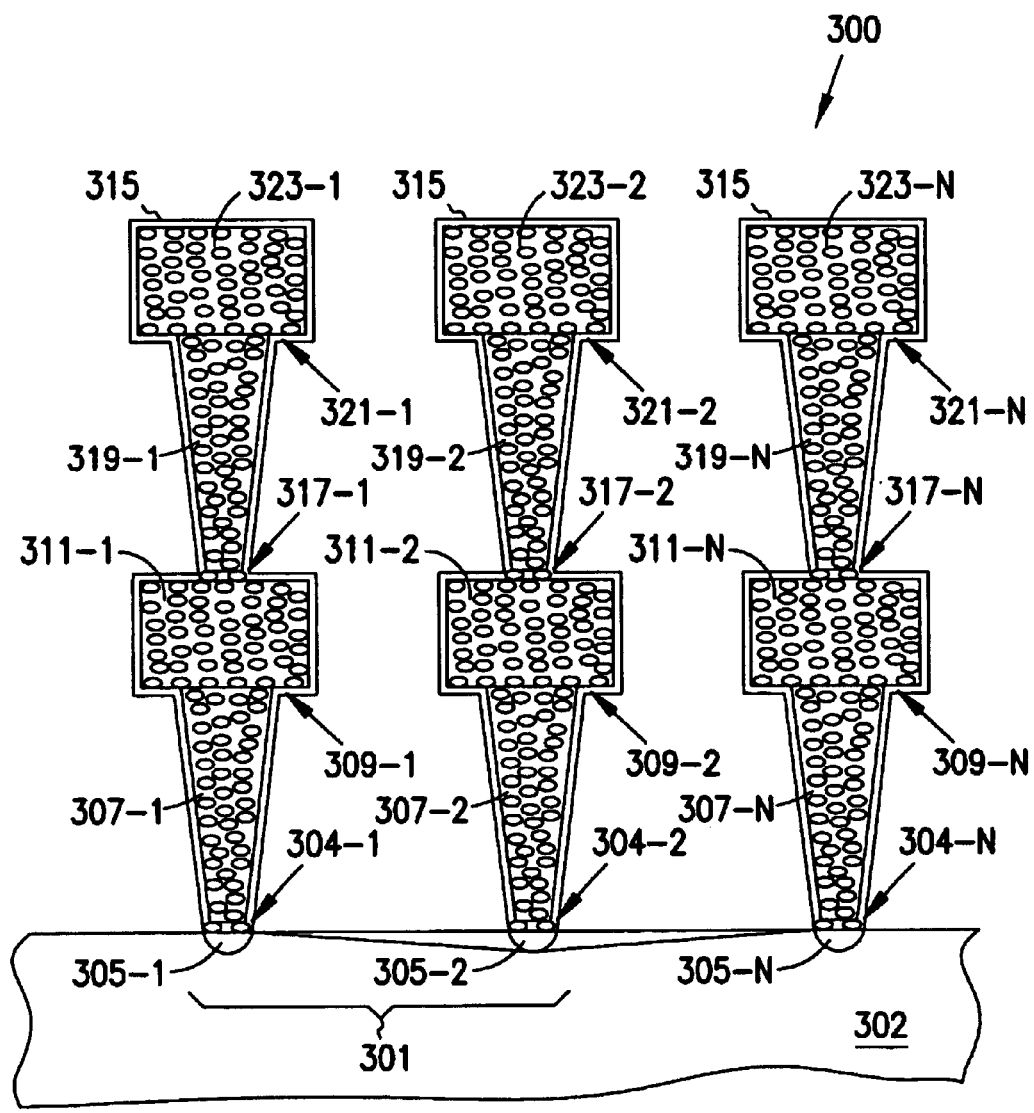
FIG. 3 is an illustration of an integrated circuit formed according to the teachings of the present invention.

FIG. 3 is an illustration of an integrated circuit 300 formed according to the teachings of the present invention. According to the teachings of the present invention, the integrated circuit 300 includes a multilayer copper wiring structure. As shown in FIG. 3, the integrated circuit 300 includes at least one semiconductor device 301 formed in a substrate 302. A first number of seed layers 304-1, 304-2, . . . , 304-N are formed on a number of portions 305-1, 305-2, . . . , 305-N of the at least one semiconductor device. As one of ordinary skill in the art will understand upon reading this disclosure the number of portions 305-1, 305-2, . . . , 305-N of the at least one semiconductor device 301 include the number of portions 305-1, 305-2, . . . , 305-N of a semiconductor device 301 which require electrical contact to subsequent integrated circuit layers formed above the semiconductor device 301. For example, the at least one semiconductor device 301 can include at least one transistor 301 which has a source and a drain region. In this scenario, the number of portions 305-1, 305-2, . . . , 305-N of a semiconductor device 301 which require electrical contact to subsequent integrated circuit layers formed above the semiconductor device 301 include the source and the drain regions 305-1, 305-2, . . . , 305-N.

As shown in FIG. 3, a number of copper vias 307-1, 307-2, . . . , 307-N, or first level of copper vias 307-1, 307-2, . . . , 307-N, are formed above and contact with the first number of seed layers 304-1, 304-2, . . . , 304-N. According to the teachings of the present invention, the first number of seed layers 304-1, 304-2, . . . , 304-N include a thin film of Palladium (Pd) or Copper. Further, the first number of seed layers 304-1, 304-2, . . . , 304-N have a thickness of less than 15 nanometers (nm). In one embodiment, the first number of seed layers 304-1, 304-2, . . . , 304-N includes a first number of seed layers 304-1, 304-2, . . . , 304-N having a discontinuous island structure with an island thickness in the range of 3 to 10 nanometers.

A second number of seed layers 309-1, 309-2, . . . , 309-N are formed on the number of copper vias 307-1, 307-2, . . . , 307-N. According to the teachings of the present invention, the second number of seed layers 309-1, 309-2, . . . , 309-N include a thin film of Palladium (Pd) or Copper. Further, the second number of seed layers 309-1, 309-2, . . . , 309-N have a thickness of less than 15 nanometers (nm). In one embodiment, the second number of seed layers 309-1, 309-2, . . . , 309-N includes a second number of seed layers 309-1, 309-2, . . . , 309-N having a discontinuous island structure with an island thickness in the range of 3 to 10 nanometers.

A number of conductor metal lines 311-1, 311-2, . . . , 311-N, or first level of conductor metal lines 311-1, 311-2, . . . , 311-N, are formed above and contact with the second number of seed layers 309-1, 309-2, . . . , 309-N. In one embodiment, the first level of conductor metal lines 311-1, 311-2, . . . , 311-N includes a number of copper metal lines 311-1, 311-2, . . . , 311-N. In one embodiment, as shown in FIG. 3, the integrated circuit 300 further includes a thin diffusion barrier 315 covering the number of copper vias 307-1, 307-2, . . . , 307-N, the number of conductor metal lines 311-1, 311-2, . . . , 311-N, and the first and the second number of seed layers, 304-1, 304-2, . . . , 304-N, and 309-1, 309-2, . . . , 309-N respectively. According to the teachings of the present invention, the thin diffusion barrier 315 has a thickness of less than 8.0 nanometers (nm). In one embodiment, the thin diffusion barrier has a thickness in the range of 2.0 to 6.0 nanometers. In one embodiment, the thin diffusion barrier 315 includes a graded composition of Tungsten Silicon Nitride (WSi$_x$N$_y$), and wherein x varies from 2.0 to 2.5.

In one embodiment, as shown in FIG. 3, the integrated circuit, or multilayer copper wiring structure 300 includes a third number of seed layers 317-1, 317-2, . . . , 317-N, including a thin film of Palladium (Pd) or Copper, are formed on the first level of copper metal lines 311-1, 311-2, . . . , 311-N, or first level of conductor metal lines 311-1, 311-2, . . . , 311-N. Further, the third number of seed layers 317-1, 317-2, . . . , 317-N have a thickness of less than 15 nanometers (nm). In one embodiment, the third number of seed layers 317-1, 317-2, . . . , 317-N includes a third number of seed layers 317-1, 317-2, . . . , 317-N having a discontinuous island structure with an island thickness in the range of 3 to 10 nanometers. A second level of copper vias 319-1, 319-2, . . . , 319-N are formed above and contacting the third number of seed layers 317-1, 317-2, . . . , 317-N. A fourth number of seed layers 321-1, 321-2, . . . , 321-N, including a thin film of Palladium (Pd) or Copper, are formed on the second level of copper vias 319-1, 3192, . . . , 319-N. In one embodiment, the fourth number of seed layers 321-1, 321-2, . . . , 321-N includes a fourth number of seed layers 321-1, 321-2, . . . , 321-N having a discontinuous island structure with an island thickness in the range of 3 to 10 nanometers. A second level of copper metal lines 323-1, 323-2, . . . , 323-N, or second level of conductor metal lines 323-1, 323-2, . . . , 323-N, are formed above and contacting fourth number of seed layers 321-1, 321-2, . . . , 321-N.

In one embodiment, as shown in FIG. 3, the thin diffusion barrier 315 further covers the second level of copper vias 319-1, 319-2, . . . , 319-N, the second level of copper metal lines 323-1, 323-2, . . . , 323-N, and the third, and fourth number of seed layers, 317-1, 317-2, . . . , 317-N and 321-1, 321-2, . . . , 321-N respectively.

CONCLUSION

Thus, structures and methods have been shown which include a selective electroless copper metallization. The present invention provides for a multilayer copper wiring structure by electroless, selectively deposited copper which will not require chemical mechanical planarization (CMP). Thus, the present invention is streamlined and significantly reduces the amount of deposited conductive material, e.g. copper, which is ultimately discarded according to conventional processes. This also alleviates important environmental concerns regarding the disposition of used materials. Further, by avoiding the need for a CMP process step the usage of consumables such as pads and slurry is conserved.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. The scope of the invention includes any other applications in which the above structures and fabrication methods are used. The scope of the invention should be determined with reference to the appended claims, along with the full scope of equivalents to which such claims are entitled.

What is claimed is:

1. A method for forming vias on a substrate, comprising:
   depositing a seed layer including a thin film of Palladium (Pd) or Copper (Cu) having a thickness of less than 15 nanometers (nm) on the substrate;
   depositing a patterned photoresist layer over the seed layer, wherein depositing the patterned photoresist layer defines a number of via holes opening to the seed layer;
   depositing a layer of copper over the seed layer using electroless plating; and
   removing the photoresist layer using oxygen plasma ashing.

2. The method of claim 1, wherein depositing a seed layer includes depositing a seed layer using a physical vapor deposition process.

3. The method of claim 1, wherein depositing a layer of copper using electroless plating includes filling the number of via holes to a top surface of the photoresist layer.

4. The method of claim 1, wherein depositing a seed layer includes forming a discontinuous seed layer having island structures with the island structures having a thickness in a range of 3 to 10 nanometers.

5. A method for forming vias on a substrate, comprising:
   depositing a seed layer including a thin film of Palladium (Pd) or Copper (Cu) having a discontinuous island structure on the substrate using a sputtering deposition technique;
   depositing a patterned photoresist layer over the seed layer, wherein depositing the patterned photoresist layer defines a number of via holes opening to the seed layer;
   depositing a layer of copper over the seed layer using electroless plating.

6. The method of claim 5, wherein depositing a first seed layer having a discontinuous island structure includes a discontinuous island structure having a thickness of less than 15 nanometers (nm).

7. The method of claim 5, wherein depositing a layer of copper over the seed layer includes forming a number of copper vias, wherein the number of copper vias form on the seed layer but not on the patterned photoresist layer.

8. The method of claim 7, wherein forming a number of copper vias includes filling the number of via holes to a top surface of the patterned photoresist layer.

9. The method of claim 5, wherein the method further includes removing the photoresist layer using oxygen plasma ashing.

10. A method for forming copper vias and a first metal layer, comprising:
    depositing a first seed layer including a thin film of Palladium (Pd) or Copper (Cu) on a substrate;
    depositing a first patterned photoresist layer, wherein depositing the first patterned photoresist layer defines a first number of via holes above the first seed layer;
    forming a first layer of or copper using electroless plating, wherein forming the first layer of copper vias using electroless plating includes filling the first number of via holes to a top surface of the first patterned photoresist layer;
    depositing a second seed layer including a thin film of Palladium (Pd) Copper (Cu) on the first layer of copper vias and the top surface of the photoresist layer;
    depositing a second patterned photoresist layer, wherein depositing the second patterned photoresist layer defines a second number of conductor line openings above the second seed layer; and
    forming a second layer of copper using electroless plating, wherein depositing a second layer of copper using electroless plating includes filling the second number of conductor line openings to a top surface of the second patterned photoresist layer.

11. The method of claim 10, wherein depositing a first seed layer includes depositing a first seed layer having a discontinuous island structure.

12. The method of claim 10, wherein depositing a first seed layer includes depositing a first seed layer using an evaporation deposition technique.

13. The method of claim 10, wherein forming a first layer of copper using electroless plating includes forming a first number of copper vias, wherein the first number of copper vias form on the first seed layer but not on the first patterned photoresist layer.

14. The method of claim 10, wherein depositing the second seed layer includes depositing the second seed layer using a physical vapor deposition process.

15. The method of claim 10, wherein depositing a second patterned photoresist layer includes depositing a second patterned photoresist layer which has a thickness which is less than a thickness of the first patterned photoresist layer.

16. The method of claim 10, wherein depositing the second patterned photoresist layer which defines a second number of conductor line openings includes a third number of first level metal line openings.

17. A method for forming a multilayer copper wiring structure, comprising:
  depositing a first seed layer on a substrate;
  patterning a first photoresist layer over the first seed layer to define a first number of via holes opening to the first seed layer;
  forming a first level of copper vias in the first number of via holes using electroless plating;
  depositing a second seed layer on the first level of copper vias and first photoresist layer;
  patterning a second photoresist layer over the second seed layer to define a second number of conductor line openings to the second seed layer;
  forming a first level of conductor lines in the second number of conductor line openings using electroless plating;
  depositing a third seed layer on the first level of conductor lines and the second photoresist layer;
  patterning a third photoresist layer over the third seed layer to define a third number of via holes opening to the third seed layer; and
  forming a second level of copper vias in the third number of via holes using electroless plating.

18. The method of claim 17, wherein the method further comprises:
  depositing a fourth seed layer on the second level of copper vias and third photoresist layer;
  patterning a fourth photoresist layer over the fourth seed layer to define a fourth number of conductor line openings to the fourth seed layer; and
  forming a second level of conductor lines in the fourth number of conductor line openings using electroless plating.

19. The method of claim 18, wherein depositing the first seed layer includes depositing a first seed layer having a discontinuous island structure.

20. The method of claim 19, wherein depositing a first seed layer having a discontinuous island structure includes depositing a discontinuous island structure of Palladium (Pd) or Copper (Cu).

21. The method of claim 18, wherein forming a first level of copper vias in the third number of via holes using electroless plating includes forming the third number of copper vias on the seed layer but not on the first photoresist layer.

22. The method of claim 18, wherein depositing a first seed layer includes depositing a first seed layer having a thickness of less than 15 nanometers (nm).

23. The method of claim 18, wherein depositing the first seed layer includes depositing the first seed layer using a physical vapor deposition process.

24. The method of claim 18, wherein patterning a second photoresist layer over the second seed layer includes patterning a second photoresist layer having a thickness which is less than a thickness of the first photoresist layer.

25. A method for forming a multilayer copper wiring structure, comprising:
  depositing a first seed layer including a thin film of Palladium (Pd) or Copper (Cu) on a substrate using a physical vapor deposition process;
  patterning a first photoresist layer over the first seed layer to define a first number of via holes opening to the first seed layer;
  forming a first level of copper vias in the first number of via holes using electroless plating;
  depositing a second seed layer on the first level of copper vias and first photoresist layer;
  patterning a second photoresist layer over the second seed layer to define a second number of conductor line openings to the second seed layer;
  forming a first level of copper lines in the second number of conductor line openings using electroless plating;
  depositing a third seed layer on the first level of copper lines and the second photoresist layer;
  patterning a third photoresist layer over the third seed layer to define a third number of via holes opening to the third seed layer;
  forming a second level of copper vias in the third number of via holes using electroless plating; and
  removing the first, second, and third photoresist layers using oxygen plasma etching.

26. The method of claim 25, wherein depositing a first seed layer including a thin film of Palladium (Pd) or Copper (Cu) on a substrate using a physical vapor deposition process includes using an evaporation deposition technique.

27. The method of claim 25, wherein removing the first, second, and third photoresist layers using oxygen plasma etching includes removing the first, second, and third seed layers.

28. The method of claim 25, wherein depositing a second and a third seed layer includes depositing a second and third seed layer having a discontinuous island structure.

29. The method of claim 28, wherein depositing a second and a third seed layer having a discontinuous island structure includes depositing a second and a third seed layer using a sputtering deposition technique.

30. The method of claim 29, wherein depositing a second and a third seed layer includes depositing a second and a third seed layer having a thickness of less than 15 nanometers (nm).

31. A method for forming a multilayer copper wiring structure, comprising:
  depositing a first seed layer including a thin film of Palladium (Pd) or Copper (Cu) on a substrate;
  patterning a first photoresist layer over the first seed layer to define a first number of via holes opening to the first seed layer;
  forming a first level of copper vias in the first number of via holes using electroless plating;
  depositing a second seed layer including a thin film of Palladium (Pd) or Copper (Cu) on the first level of copper vias and first photoresist layer;
  patterning a second photoresist layer over the second seed layer to define a second number of conductor line openings to the second seed layer;
  forming a first level of copper lines in the second number of conductor line openings using electroless plating;
  depositing a third seed layer including a thin film of Palladium (Pd) or Copper (Cu) on the first level of copper lines and the second photoresist layer;

patterning a third photoresist layer over the third seed layer to define a third number of via holes opening to the third seed layer; and forming a second level of copper vias in the third number of via holes using electroless plating;

depositing a fourth seed layer including a thin film of Palladium (Pd) or Copper (Cu) on the second level of copper vias and third photoresist layer;

patterning a fourth photoresist layer over the fourth seed layer to define a fourth number of conductor line openings to the fourth seed layer; and forming a second level of copper lines in the fourth number of conductor line openings using electroless plating.

32. The method of claim 31, wherein the depositing the first, second, third, and fourth seed layers includes depositing a first, second, third, and fourth seed layer having a discontinuous island structure.

33. The method of claim 32, wherein depositing a first, second, third, and fourth seed layer having a discontinuous island structure includes depositing a first, second, third, and fourth seed layer using a sputtering deposition technique.

34. The method of claim 33, wherein depositing a first, second, third, and fourth seed layer having a discontinuous island structure includes depositing a first, second, third, and fourth seed layer having thickness of less than 10 nanometers (nm).

35. The method of claim 31, wherein the method further includes removing the first, second, third, and fourth photoresist layers using an oxygen plasma etching.

36. The method of claim 35, wherein removing the first, second, third, and fourth photoresist layers using an oxygen plasma etching includes removing the first, second, third, and fourth seed layers.

37. The method of claim 36, wherein the further includes forming a thin diffusion barrier on the first number of via holes and on the third number of via holes and on the first level and the second level of copper lines.

38. The method of claim 37, wherein forming a thin diffusion barrier includes forming a thin diffusion barrier of Tungsten Silicon Nitride ($WSi_xN_y$) having a thickness of less than 8 nanometers (nm).

39. The method of claim 38, wherein forming a thin diffusion barrier of Tungsten Silicon Nitride ($WSi_xN_y$) having a thickness of less than 8 nanometers (nm) includes forming a graded composition of $WSi_x$, where x varies from 2.0 to 2.5, and nitriding the graded composition of $WSi_x$.

* * * * *

UNITED STATES PATENT AND TRADEMARK OFFICE
CERTIFICATE OF CORRECTION

PATENT NO.      : 7,211,512 B1                                   Page 1 of 16
APPLICATION NO. : 09/483881
DATED           : May 1, 2007
INVENTOR(S)     : Ahn et al.

It is certified that error appears in the above-identified patent and that said Letters Patent is hereby corrected as shown below:

On the Title page, in field (56), under "U.S. Patent Documents", in column 1, line 1, above
    "2,842,438 A   7/1958    Saarivirta et al.   75/153" insert
  -- 1,254,987    1/1918     Cooper
    1,976,375    10/1934    Smith, J. K.        148/11.5
    2,244,608    6/1941     Cooper, H. S.       75/138 --.

On the Title page, in field (56), under "U.S. Patent Documents", in column 1, line 2, below
    "2,842,438 A   7/1958    Saarivirta et al.   75/153" insert
  -- 3,147,110    9/1964     Foerster            75/122.5
    3,337,334    8/1967     Fenn et al.         75/150
    3,506,438    4/1970     Krock et al.        75/208
    3,548,915    10/1970    Richmond et al.     164/68
    3,548,948    12/1970    Richmond et al.     164/68
    3,687,737    8/1972     Krock et al.        148/2
    3,832,456    8/1974     Kobetz et al.       423/645
    3,932,226    1/1976     Klatskin et al.     204/16
    3,954,570    6/1976     Shirk et al.        204/15
    4,022,931    5/1977     Black et al.        427/91
    4,029,377    6/1977     Guglielmi           339/19
    4,065,330    12/1977    Masumoto et al.     148/31.55
    4,101,855    7/1978     Drapeau             335/106
    4,158,719    6/1979     Frantz              428/567
    4,213,818   * 7/1980    Lemons et al.       438/719
    4,233,066    11/1980    Sundin et al.       75/142
    4,314,594    2/1982     Pfeifer et al.      148/108
    4,386,116    5/1983     Nair et al.         427/99
    4,389,429    6/1983     Soclof              438/492
    4,423,547    1/1984     Farrar et al.       29/571
    4,561,173    12/1985    Te Velde            438/619           --.

On the Title page, in field (56), under "U.S. Patent Documents", in column 1, line 4, below
    "4,565,157 A   1/1986    Brors et al." insert
  -- 4,574,095    3/1986     Blaum et al.        427/53.1
    4,670,297    6/1987     Lee et al.          427/91
    4,709,359    11/1987    Loftin              367/155           --.

On the Title page, in field (56), under "U.S. Patent Documents", in column 1, line 5, below
    "4,762,728 A   8/1988    Keyser et al.       427/38" insert
  -- 4,788,082    11/1988    Schmitt             427/248.1
    4,824,544    4/1989     Mikalesen et al. --.

UNITED STATES PATENT AND TRADEMARK OFFICE
CERTIFICATE OF CORRECTION

| | |
|---|---|
| PATENT NO. | : 7,211,512 B1 |
| APPLICATION NO. | : 09/483881 |
| DATED | : May 1, 2007 |
| INVENTOR(S) | : Ahn et al. |

It is certified that error appears in the above-identified patent and that said Letters Patent is hereby corrected as shown below:

On the Title page, in field (56), under "U.S. Patent Documents", in column 1, line 6, below
    "4,847,111 A    7/1989    Chow et al.    427/38" insert
    -- 4,857,481    8/1989    Tam et al.    437/182
    4,931,410    6/1990    Tokunaga et al.    437/189
    4,933,743    6/1990    Thomas et al. --.

On the Title page, in field (56), under "U.S. Patent Documents", in column 1, line 8, below
    "4,962,058 A    10/1990    Cronin et al.    437/187" insert
    -- 4,996,584    2/1991    Young et al.    357/71
    5,019,531    5/1991    Awaya et al.    437/180    --.

On the Title page, in field (56), under "U.S. Patent Documents", in column 1, line 10, below
    "5,043,299 A    8/1991    Chang et al." insert
    -- 5,045,635    9/1991    Kaplo et al.    174/35 GC
    5,071,518    12/1991    Pan --.

On the Title page, in field (56), under "U.S. Patent Documents", in column 1, line 11, below
    "5,084,412 A    1/1992    Nakasaki    437/189" insert
    -- 5,100,499    3/1992    Douglas    156/635    --.

On the Title page, in field (56), under "U.S. Patent Documents", in column 1, line 12, below
    "5,130,274 A    7/1992    Harper et al.    437/195" insert
    -- 5,148,260    9/1992    Inoue et al.    357/67
    5,149,615    9/1992    Chakravorty et al.    430/313    --.

On the Title page, in field (56), under "U.S. Patent Documents", in column 1, line 15, below
    "5,180,687 A    1/1993    Mikoshiba et al." insert
    -- 5,227,658    7/1993    Beyer et al.    257/522
    5,231,036    7/1993    Miyauchi et al.    --.

On the Title page, in field (56), under "U.S. Patent Documents", in column 1, line 16, below
    "5,231,056 A    7/1993    Sandhu    437/200" insert
    -- 5,232,866    8/1993    Beyer et al.    437/62
    5,240,878    8/1993    Fitzsimmons et al.    437/187
    5,243,222    9/1993    Harper et al.    257/774
    5,256,205    10/1993    Schmitt III et al.    118/723
    5,268,315    12/1993    Prasad et al.    437/31
    5,308,440    5/1994    Chino et al.    156/664
    5,324,683    6/1994    Fitch et al.    437/65
    5,324,684    6/1994    Kermani et al.    437/95
    5,334,356    8/1994    Baldwin et al.    422/133
    5,336,914    8/1994    Andoh    257/368    --.

UNITED STATES PATENT AND TRADEMARK OFFICE
CERTIFICATE OF CORRECTION

PATENT NO. : 7,211,512 B1  
APPLICATION NO. : 09/483881  
DATED : May 1, 2007  
INVENTOR(S) : Ahn et al.

Page 3 of 16

It is certified that error appears in the above-identified patent and that said Letters Patent is hereby corrected as shown below:

On the Title page, in field (56), under "U.S. Patent Documents", in column 1, line 17, below
   "5,348,811 A    9/1994        Nagao et al." insert
-- 5,354,712     10/1994       Ho et al.       437/195
    5,356,672     10/1994       Schmitt III et al.   427/446    --.

On the Title page, in field (56), under "U.S. Patent Documents", in column 2, line 1, above
   "5,413,687 A    5/1995        Barton et al.  204/192.14" insert
-- 5,374,849     12/1994       Tada
    5,384,284     1/1995        Doan et al.     437/190
    5,399,897     3/1995        Cunningham et al. 257/467
    5,401,680     3/1995        Abt et al.
    5,408,742     4/1995        Zaidel et al.   29/846    --.

On the Title page, in field (56), under "U.S. Patent Documents", in column 2, line 2, below
   "5,413,687 A    5/1995        Barton et al.     204/192.14" insert
-- 5,413,962     5/1995        Lur et al.      437/195
    5,424,030     6/1995        Takahashi     420/473
    5,426,330     6/1995        Joshi et al.    257/752
    5,442,237     8/1995        Hughes et al.  257/759
    5,444,015     8/1995        Aitken et al.   437/182    --.

On the Title page, in field (74), in "Attorney, Agent, or Firm", in column 2, line 1, delete "Lunberg" and insert -- Lundberg --, therefor.

On page 2, in field (56), under "U.S. Patent Documents", in column 1, line 2, below
   "5,447,887 A    9/1995        Filipiak et al.   437/200" insert
-- 5,457,344     10/1995       Bartelink      257/737
    5,470,789     11/1995       Misawa       437/190
    5,470,801     11/1995       Kapoor et al.  437/238
    5,476,817     12/1995       Numata       437/195
    5,485,037     1/1996        Marrs.        257/712
    5,495,667    * 5/1996       Earnworth et al. 29
    5,506,449     41996         Nakano et al.  257/758
    5,510,645     4/1996        Fitch et al.    257/522
    5,529,956     61996         Morishita     437/195
    5,534,731     7/1996        Cheung       257/759
    5,538,922     7/1996        Cooper et al.  437/195
    5,539,060     7/1996        Tsunogae et al. 525/338
    5,539,227     7/1996        Nakano       257/276    --.

UNITED STATES PATENT AND TRADEMARK OFFICE
CERTIFICATE OF CORRECTION

PATENT NO.         : 7,211,512 B1
APPLICATION NO. : 09/483881
DATED                 : May 1, 2007
INVENTOR(S)       : Ahn et al.

It is certified that error appears in the above-identified patent and that said Letters Patent is hereby corrected as shown below:

On page 2, in field (56), under "U.S. Patent Documents", in column 1, line 3, below
    "5,572,072 A    11/1996    Lee" insert
  -- 5,578,146    11/1996    Grant et al.    148/437    --.

On page 2, in field (56), under "U.S. Patent Documents", in column 1, line 5, below
    "5,609,721 A    3/1997    Tsukune et al.    156/646.1" insert
  -- 5,625,232    4/1997    Numata et al.    257/758
     5,633,200    5/1997    Hu
     5,635,253    6/1997    Canaper    427/437    --.

On page 2, in field (56), under "U.S. Patent Documents", in column 1, line 6, below
    "5,654,245 A    8/1997    Allen    438/629" insert
  -- 5,662,788    9/1997    Sandhu et al.    205/87
     5,667,600    9/1997    Grensing et al.    148/437    --.

On page 2, in field (56), under "U.S. Patent Documents", in column 1, line 7, below
    "5,670,420 A    9/1997    Choi    437/189" insert
  -- 5,674,787    10/1997    Zhao et al.    437/230
     5,675,187    10/1997    Numata et al.    257/758
     5,679,608    10/1997    Cheung et al.    437/195
     5,681,441    10/1997    Svendsen et al.    205/114
     5,693,563    12/1997    Teong
     5,695,810    12/1997    Dubin et al.    427/96
     5,705,425    1/1998    Miura et al.    437/182    --.

On page 2, in field (56), under "U.S. Patent Documents", in column 1, line 8, below
    "5,719,089 A    2/1998    Cherng et al.    438/637" insert
  -- 5,719,410    2/1998    Suehiro et al.    257/77
     5,719,447    2/1998    Gardner
     5,725,689    3/1998    Nishida et al.    148/320
     5,739,579    4/1998    Chiang et al.    257/635    --.

On page 2, in field (56), under "U.S. Patent Documents", in column 1, line 9, below
    "5,763,953 A    6/1998    Iljima et al.    257/762" insert
  -- 5,780,358    7/1998    Zhou    438/645
     5,785,570    7/1998    Bruni    445/52
     5,789,264    8/1998    Chung
     5,792,522    8/1998    Jin et al.    427/575
     5,792,706    8/1998    Michael et al.    438/626
     5,801,098    9/1998    Fiordalice et al.    438/653
     5,814,557    9/1998    Venkataraman et al.    438/622
     5,821,168    10/1998    Jain    438/692    --.

UNITED STATES PATENT AND TRADEMARK OFFICE
CERTIFICATE OF CORRECTION

PATENT NO. : 7,211,512 B1
APPLICATION NO. : 09/483881
DATED : May 1, 2007
INVENTOR(S) : Ahn et al.

It is certified that error appears in the above-identified patent and that said Letters Patent is hereby corrected as shown below:

On page 2, in field (56), under "U.S. Patent Documents", in column 1, line 10, below "5,824,599 A  10/1998  Schacham-Diamand et al.  438/678" insert
-- 5,840,625   11/1998   Feldner
   5,852,871   12/1998   Khandros          29/843
   5,858,877   1/1999    Dennison et al.   438/700
   5,880,018   03/1999   Boeck             438/619          --.

On page 2, in field (55), under "U.S. Patent Documents", in column 1, line 11, below "5,891,797 A  4/1999  Farrar  438/619" insert
-- 5,880,018   4/1999   Havemann et al.   438/674
   5,893,752   4/1999   Zhang et al.      438/687          --.

On page 2, in field (56), under "U.S. Patent Documents", in column 1, line 12, below "5,895,740 A  4/1999  Chien et al.  430/313" insert
-- 5,897,370   4/1999   Joshi et al.   438/632
   5,899,740   5/1999   Kwon
   5,900, 668  5/1999   Wollesen       257/522              --.

On page 2, in field (56), under "U.S. Patent Documents", in column 1, line 13, below "5,907,772 A  5/1999  Iwasaki  438/253" insert
-- 5,911,113       6/1999   Yao et al.         438/649
   5,913,147       6/1999   Dubin et al.       438/687
   5,925,930       7/1999   Farnworth et al.   257/737
   5,930,596       7/1999   Klose et al.       438/98
   5,930,669       7/1999   Uzoh               438/627
   5,932,928       8/1999   Clampitt           257/758
   5,933,758       8/1999   Jain               438/687
   5,937,320 A *   8/1999   Andricacos et al.  438/614
   5,940,733       8/1999   Beinglass et al.   438/655       --.

On page 2, in field (56), under "U.S. Patent Documents", in column 1, line 15, below "5,962,923 A  10/1999  Xu et al.  257/774" insert
-- 5,968,327   10/1999   Kobayashi et al.
   5,968,333   10/1999   Nogami et al.   205/184
   5,969,422   10/1999   Ting et al.     257/762            --.

On page 2, in field (56), under "U.S. Patent Documents", in column 1, line 16, below "5,972,179 A  10/1999  Chittipeddi et al.  204/192.17" insert
-- 5,972,804   10/1999   Tobin et al.     438/786
   5,976,710   11/1999   Sachdev et al.   428/620
   5,981,350   11/1999   Geusic et al.    438/386
   5,985,759   11/1999   Kim et al.       438/653           --.

UNITED STATES PATENT AND TRADEMARK OFFICE
CERTIFICATE OF CORRECTION

PATENT NO. : 7,211,512 B1
APPLICATION NO. : 09/483881
DATED : May 1, 2007
INVENTOR(S) : Ahn et al.

It is certified that error appears in the above-identified patent and that said Letters Patent is hereby corrected as shown below:

On page 2, in field (56), under "U.S. Patent Documents", in column 1, line 17, below
    "5,989,623 A    11/1999    Chen et al.    427/97" insert
  -- 5,994,776    11/1999    Fang et al.    257/758    --.

On page 2, in field (56), under "U.S. Patent Documents", in column 1, line 18, below
    "6,001,736 A    12/1999    Kondo et al." insert
  -- 6,004,884    12/1999    Abraham    438/714
     6,008,117    12/1999    Hong et al.    438/629    --.

On page 2, in field (56), under "U.S. Patent Documents", in column 1, line 19, below
    "6,015,465 A    1/2000    Kholodenko et al.    118/719" insert
  -- 6,015,738    1/2000    Levy et al.    438/275    --.

On page 2, in field (56), under "U.S. Patent Documents", in column 1, line 20, below
    "6,017,820 A    1/2000    Ting et al." insert
  -- 6,022,802    2/2000    Jang    438/656
     6,028,362    2/2000    Omura
     6,025,261    2/2000    Farrar et al.    438/619
     6,030,877    2/2000    Lee et al.    438/381
     6,030,895    2/2000    Joshi et al.
     6,037,248    3/2000    Ahn    438/619
     6,054,172    4/2000    Robinson et al.    427/97
     6,057,226    5/2000    Wong    438/623
     6,065,424    5/2000    Shachem-Diamand et al.    118/696
     6,069,068    5/2000    Rathore et al.    438/628    --.

On page 2, in field (56), under "U.S. Patent Documents", in column 1, line 21, below
    "6,071,810 A    6/2000    Wade et al.    438/635" insert
  -- 6,075,278    6/2000    Farrar    257/522
     6,075,287    6/2000    Ingraham et al.
     6,091,136    7/2000    Jiang et al.    257/676
     6,091,475    7/2000    Ogino et al.    349/149
     6,100,193    8/2000    Suehiro et al.    438/685
     6,103,320    8/2000    Matsumoto et al.
     6,120,641    10/2000    Stevens et al.    456/345.22
     6,121,126    9/2000    Ahn et al.    438/602
     6,126,989    10/2000    Robinson et al.    427/97    --.

UNITED STATES PATENT AND TRADEMARK OFFICE
CERTIFICATE OF CORRECTION

PATENT NO.       : 7,211,512 B1
APPLICATION NO.  : 09/483881
DATED            : May 1, 2007
INVENTOR(S)      : Ahn et al.

It is certified that error appears in the above-identified patent and that said Letters Patent is hereby corrected as shown below:

On page 2, in field (56), under "U.S. Patent Documents", in column 1, line 25, below
    "6,140,234 A   10/2000    Uzoh et al." insert
-- 6,140,456   10/2000    Lee et al.       528/196
    6,143,641    11/2000    Kitch           438/618
    6,143,655    11/2000    Forbes et al.             --.

On page 2, in field (56), under "U.S. Patent Documents", in column 1, line 26, below
    "6,143,646 A   11/2000    Wetzel et al.   438/637" insert
-- 6,143,671   11/2000    Sugai
    6,150,214    11/2000    Kaeriyama
    6,150,261    11/2000    Hsu et al.      438/640    --.

On page 2, in field (56), under "U.S. Patent Documents", in column 1, line 28, below
    "6,153,507 A   11/2000    Mikagi et al.   438/618" insert
-- 6,159,769   12/2000    Farnworth et al.   438/108
    6,159,842    12/2000    Chang et al.     438/622
    6,169,024    1/2001     Hussein              --.

On page 2, in field (56), under "U.S. Patent Documents", in column 1, line 29, below
    "6,171,661 B1  1/2000     Zheng et al.    427/535" insert
-- 6,174,804   1/2001     Hsu                   --.

On page 2, in field (56), under "U.S. Patent Documents", in column 1, line 31, below
    "6,183,564 B1  2/2001     Reynolds et al.  118/719" insert
-- 6,187,656   2/2001     Lu et al.        438/592    --.

On page 2, in field (56), under "U.S. Patent Documents", in column 1, line 33, below
    "6,197,688 B1  3/2001     Simpson        4380/678" insert
-- 6,197,181  *  3/2001     Chen            205/123
    6,204,065    3/2001     Ochiai        436/66     --.

On page 2, in field (56), under "U.S., Patent Documents", in column 1, line 34, below
    "6,207,222 B1  3/2001     Chen et al.     427/678" insert
-- 6,207,553   5/2001     Buynoski et al.  438/622
    6,207,558    3/2001     Singhbi et al.   438/648
    6,208,016    3/2001     Farrar        257/643    --.

UNITED STATES PATENT AND TRADEMARK OFFICE
CERTIFICATE OF CORRECTION

PATENT NO. : 7,211,512 B1
APPLICATION NO. : 09/483881
DATED : May 1, 2007
INVENTOR(S) : Ahn et al.

It is certified that error appears in the above-identified patent and that said Letters Patent is hereby corrected as shown below:

On page 2, in field (56), under "U.S. Patent Documents", in column 1, line 35, below
"6,211,073 B1    4/2001    Ahn et al.       438/653" insert
-- 6,211,049    4/2001    Farrar           438/597
   6,211,561    4/2001    Zhao             257/522
   6,214,719    4/2001    Nag              438/619
   6,215,186    4/2001    Konecni et al.
   6,218,282    4/2001    Buynoski         438/619
   6,221,763    4/2001    Gilton           438/643      --.

On page 2, in field (56), under "U.S. Patent Documents", in column 1, line 36, below
"6,232,219 B1    5/2001    Blalock et al.   438/637" insert
-- 6,245,658    6/2001    Buynoski         438/619
   6,245,662 B1 *  6/2001 Naik et al.      438/622
   6,246,118    6/2001    Buynoski         257/758      --.

On page 2, in field (56), under "U.S. Patent Documents", in column 1, line 38, below
"6,251,781 B1    6/2001    Zhou et al.      438/637" insert
-- 6,258,707    7/2001    Uzoh --.

On page 2, in field (56), under "U.S. Patent Documents", in column 1, line 39, below
"6,265,311 B1    7/2001    Hautala et al.   438/680" insert
-- 6,265,811    7/2001    Takeuchi et al.
   6,268,276    7/2001    Chan et al.      438/619
   6,268,277    7/2001    Bang             438/619      --.

On page 2, in field (56), under "U.S. Patent Documents", in column 1, line 40, below
"6,271,592 B1    8/2001    Kim et al.       257/751" insert
-- 6,277,263    8/2001    Chen             205/182
   6,281,585    8/2001    Bothra           257/758
   6,284,656    9/2001    Farrar           438/687
   6,287,954    9/2001    Ashley           438/622
   6,288,442    9/2001    Farrar           257/678
   6,288,447    9/2001    Amishiro et al.
   6,288,905    9/2001    Chung            361/771
   6,290,833    9/2001    Chen             205/182      --.

UNITED STATES PATENT AND TRADEMARK OFFICE
CERTIFICATE OF CORRECTION

PATENT NO. : 7,211,512 B1
APPLICATION NO. : 09/483881
DATED : May 1, 2007
INVENTOR(S) : Ahn et al.

It is certified that error appears in the above-identified patent and that said Letters Patent is hereby corrected as shown below:

On page 2, in field (56), under "U.S. Patent Documents", in column 1, line 42, below
   "6,303,505 B1   10/2001   Ngo et al." insert
   -- 6,323,543   11/2001   Jiang et al.   257/676
      6,323,553   11/2001   Hsu et al.   257/751
      6,326,303   12/2001   Robinson et al.   38/678
      6,329,279   12/2001   Lee   438/619
      6,342,448   1/2002   Lin et al.   438/687
      6,358,842   3/2002   Zhou et al.   438/633
      6,358,849   3/2002   Havemann et al.   438/689
      6,359,328   3/2002   Dunbin   257/62   --.

On page 2, in field (56), under "U.S. Patent Documents", in column 1, line 43, below
   "6,365,511 B1   4/2002   Kizilyalli et al." insert
   -- 6,368,954   4/2002   Lopatin et al.   438/622
      6,368,966   4/2002   Krishnamoorthy   438/687   --.

On page 2, in field (56), under "U.S. Patent Documents", in column 1, line 44, below
   "6,372,622 B1 *   4/2002   Tan et al." insert
   -- 6,376,370   4/2002   Farrar   438/678
      6,383,920   5/2002   Wang et al.   438/639   --.

On page 2, in field (56), under "U.S. Patent Documents", in column 1, line 45, below
   "6,387,542 B1 *   5/2002   Kozlov et al." insert
   -- 6,399,489   6/2002   M'Saad et al.   438/680   --.

On page 2, in field (56), under "U.S. Patent Documents", in column 1, line 46, below
   "6,403,481 B1 *   6/2002   Matsuda et al." insert
   -- 6,403,481   6/2002   Matsuda et al.   438/687
      6,417,094   7/2002   Zhao et al.
      6,428,673   8/2002   Ritzdorf et al.   205/84
      6,429,120   8/2002   Ahn et al.   438/635
      6,486,533   11/2002   Krishnamoorthy et al.   257/586
      6,492,266   12/2002   Ngo et al.
      6,508,920   1/2003   Ritzdorf et al.   204/194
      6,518,198   2/2003   Klein   438/758
      6,552,432   4/2003   Farrar   257/751
      6,563,219   5/2003   Ireland et al.   257/758
      6,565,729   5/2003   Chen et al.   205/82
      6,589,863   7/2003   Usami
      6,614,099   9/2003   Farrar   257/643
      6,632,345   10/2003   Chen   205/182
      6,638,410   10/2003   Chen et al.   205/182

UNITED STATES PATENT AND TRADEMARK OFFICE
CERTIFICATE OF CORRECTION

PATENT NO. : 7,211,512 B1
APPLICATION NO. : 09/483881
DATED : May 1, 2007
INVENTOR(S) : Ahn et al.

It is certified that error appears in the above-identified patent and that said Letters Patent is hereby corrected as shown below:

On page 2, in field (56), under "U.S. Patent Documents", in column 1, line 46, (cont'd)

| | | | |
|---|---|---|---|
| 6,664,197 | 12/2003 | Stevens et al. | 438/754 |
| 6,743,716 | 6/2004 | Farrar | 438/652 |
| 6,756,298 | 6/2004 | Ahn et al. | 438/635 |
| 2001/0002333 | 5/2001 | Huang et al. | 438/637 |
| 2001/0054771 | 12/2001 | Wark et al. | 257/786 |
| 2002/0014646 | 2/2002 | Tsu et al. | 257/296 |
| 2002/0028552 | 3/2002 | Lee et al. | 438/243 |
| 2002/0096768 | 7/2002 | Joshi | 257/750 |
| 2002/0109233 | 8/2002 | Farrar | 257/762 |
| 2002/0167089 A1 | 11/2002 | Ahn et al. | 257/762 |
| 2003/0034560 A1 | 2/2003 | Matsuse et al. | |
| 2004/0206308 A1 | 10/2004 | Ahn et al. | |
| 2005/0023697 A1 | 2/2005 | Ahn et al. | -- . |

On page 3, in field (56), under "Other Publications", in column 1, line 37, delete "electrless" and insert -- electroless --, therefor.

On page 3, in field (56), under "Other Publications", in column 1, line 37, delete "Si02" and insert -- $SiO_2$ --, therefor.

On page 3, in field (56), under "Other Publications", in column 1, line 43, delete "on" and insert -- of --, therefor.

On page 3, in field (56), under "Other Publications", in column 2, line 22, delete "mangetron" and insert -- magnetron --, therefor.

On page 3, in field (56), under "Other Publications", in column 2, line 52, delete "SiO2" and insert -- $SiO_2$ --, therefor, On page 3, in field (56), under "Other Publications", in column 2, line 64, below "Thin Solid Films, 318, pp. 234-238, (1998)." insert
-- Abe, K. , et al., "Sub-half Micron Copper Interconnects Using Reflow of Sputtered Copper Films", VLSI Multilevel Interconnection Conference, (June 25- 27, 1995), 308-311.
AMERICAN SOCIETY FOR METALS Metals Handbook, 8th Edition. Vol. 8, Metals Park, Ohio, (1973), 300-302.
AMERICAN SOCIETY FOR METALS, Metals Handbook, Ninth Edition. Vol. 2, Properties and Selection: Nonferrous Alloys and Pure Metals, ASM Handbook Committee, (eds.), American Society for Metals, Metals Park, OH, (1989), 157, 395.

UNITED STATES PATENT AND TRADEMARK OFFICE
CERTIFICATE OF CORRECTION

PATENT NO. : 7,211,512 B1
APPLICATION NO. : 09/483881
DATED : May 1, 2007
INVENTOR(S) : Ahn et al.

It is certified that error appears in the above-identified patent and that said Letters Patent is hereby corrected as shown below:

On page 3, in field (56), under "Other Publications", in column 2, line 64, (cont'd)

AMERICAN SOCIETY FOR METALS, "Phase Diagrams", Metals Handbook, 10th Ed. Vol. 3, Metals Park, Ohio, (1992).
Anonymo, "Formation of Conductors at Variable Depths – Using Differential Photomask, Projecting Images into Insulator by Reactive Ion Etching, Selectively Filling Images with Conductor", Research Disclosure, Disclosure No. RD 291015, Abstract, (July 10, 1988), 1 page.
Chang, J. Y. C. , et al. "Large Suspended Inductors on Silicon and their use in a 2-urn CMOS RF Amplifier", IEEE Electron Device Letters. 14(5), (May 1993), 246-248.
Craig, J. D., "Polymide Coatings", Packaging. Electronic Materials Handbook, Vol. 1. ASM International Handbook Committee (eds.), ASM International, Materials Park, OH, (1989), 767-772.
DOW COMPANY, "SILK' D Semiconductor Dielectric Resin", http://www.dow.com/silk/odf/618-00317.pdf, (Unknown), 2 pages.
DOW COMPANY, "SILK' J Semiconductor Dielectric Resin", http://www.dow.com/silk/adf/618-00316.4df (unknown), 2 pages.
Dudzinski, N., et al., "The Youngs Modulus of Some Aluminim Alloys", J. Institute of Metals, Vol. LXXIV, (1947-48), 291-314.
Ernst, et al., "Growth Model for Metal Films on Oxide Surface: Cu on ZnO(0001)-O''", Physical Review B, 47, (May 15, 1993), 13782-13796.
Fleming, J. G., et al., "Use Of Air Gap Structures To Lower Level Intralevel Capacitance", Proceedings of the 1997 Dielectrics for ULSI Multi-level Interconnect Conference, (1997), 140.
Grill, A. , et al., "Low dielectric constant films prepared by plasma-enhanced chemical vapor deposition from tetramethvisilane", Journal of Applied Physics, 85(6), (1999), 3314-3318.
Hirao, S., et al., "A Novel Copper Reflow Process Using Dual Wetting Layers", 1997 Symposium on VLSI Technology, Digest of Technical Papers, (1997), 57-58.
Izaki, M., et al., "Characterization of Transparent Zinc Oxide Films Prepared by Electrochemical Reaction", Journal of the Electrochemical Society, 144. (June 1997), 1949-1952.
Jayaraj, K., et al., "Low Dielectric Constant Microcellular Foams", Proceedings from the Seventh Meeting of the DuPont Symposium on Polymides in Microelectrics, September 1996, 474-501.
Jin, C., et al., "Porous Xerogel Films as Ultra-low Permittivity Dielectrics for ULSI Interconnect Applications", Conference Proceedings ULSI XII -1997. Materials Research Society (1997), 463-469.
Kang, H. K., et al., "Grain Structure and Electromigration Properties of CVD CU Metallization" Proceedings of the 10th International VLSI Multilevel Interconnection Conference June 8-9, 1993, 223-229.

UNITED STATES PATENT AND TRADEMARK OFFICE
CERTIFICATE OF CORRECTION

PATENT NO. : 7,211,512 B1
APPLICATION NO. : 09/483881
DATED : May 1, 2007
INVENTOR(S) : Ahn et al.

It is certified that error appears in the above-identified patent and that said Letters Patent is hereby corrected as shown below:

On page 3, in field (56), under "Other Publications", in column 2, line 64, (cont'd)

Kirk, Raymond E., Kirk-Othmer Concise Encyclopedia of Chemical Technology, Grayson, M., (ed.), John Wiley & Sons, Inc., New York, NY, (1985), 433-435, 926-938.
Martin, Steven J., "The Invention and Development of a Low-Dielectric Constant Polymer for the Fabrication of Integrated Circuit Interconnect", Seminar - Department of Chemical Engineering - North Carolina State University, (April 9, 2001), 1 page.
MIN, J., "Metal-organic atomic-layer deposition of titanium-silicon-nitride films", Applied Physics Letters, 75(11), (1999), 1521-1523.
Miyake, T., et al., "Atomic Hydrogen Enhanced Reflow of Copper" Applied, Physics Letters. 70(10), (1997), 1239-1241.
Palleau, J., et al., "Refractory Metal Encapsulation in Copper Wiring", Advanced Metallization for Devices and Circuits-Science, Technology and Manufacturability, Materials Research Society Symposium Proceedings, 337, (April 1994), 225 – 231.
Park, C. W., et al., "Activation Energy for Electromigration in Cu Films", Applied Physics Letters, 59(2), (July 6, 1991), 175-177.
Quan, Y. C., et al., "Polymer-like Organic Thin Films Deposited by Plasma Enhanced Chemical Vapor Deposition Using the Para-xylene Precursor as Low Dielectric Constant Interlayer Dielectrics for Multilevel Metallization", Japanese Journal of Applied Physics. Vol. 38. Part1, No. 3A 1999, 1356-1358.
Ramos, T, et al., "Nanoporous Silica for Dielectric Constant Less Than 2", Conference Proceedings ULSI XII - 1997 Materials Research Society, (1997), 455-461.
Rossnagel, S. M., "Magnetron Sputter Deposition of Interconnect Applications", Conference Proceedings, ULSI XI, (1996), 227-232.
Shacham-Diamand, Y., "100 nm Wide Copper Lines Made by Selective Electroless Deposition", Journal of Micromechanics and Microengineering. 1, (March 1991), 66-72.
Shieh, B., et al., "Air-Gap Formation During IMD Deposition to Lower Interconnect Capacitance", IEEE Electron Device Letters, 19(1), (1998), 16-18.
Singer, Ferdinand L., "Strength of Materials", Harper & Brothers. New York, (1951), 229-32.
Srivatsa, A. R., et al., "Jet Vapor Deposition: an Alternative to Electrodeposition", Surface Engineering. 11, (1995), 75-77.
Tao, J., et al., "Electromigration Characteristics of Copper Interconnects", IEEE Electron Devices Letters, 14(5), (May 1993), 249-251.
Ting, C. H., "Methods and Needs for Low K Material Research", Materials Research Society Symposium Proceedings. Volume 381, Low-Dielectric Constant Materials -- Synthesis and Applications in Microelectronics, Lu, T.M., et al., (eds.), San Francisco, CA, (April 17-19, 1995), 3-17.
Uchida, Y., et al., "A Fluorinated Organic-Silica Film with Extremely Low Dielectric Constant", Japanese Journal of Applied Physics. Vol. 38 Part1 No. 4B, (April 1999), 2368-2372.

UNITED STATES PATENT AND TRADEMARK OFFICE
CERTIFICATE OF CORRECTION

| | | |
|---|---|---|
| PATENT NO. | : 7,211,512 B1 | Page 13 of 16 |
| APPLICATION NO. | : 09/483881 | |
| DATED | : May 1, 2007 | |
| INVENTOR(S) | : Ahn et al. | |

It is certified that error appears in the above-identified patent and that said Letters Patent is hereby corrected as shown below:

On page 3, in field (56), under "Other Publications", in column 2, line 64, (cont'd)

Ueda, T., et al., "A novel Air Gap Integration Scheme for Multi-level Interconnects using Self-aligned Via Plugs" Symposium on VLSI Technology Digest of Technical Papers (1998), 46-47.
Wang, X. W., et al., "Highly Reliable Silicon Nitride Thin Films Made by Jet Vapor Deposition", Japanese Journal of Applied Physics. Vol. 34, Putt No. 2B, (February 1995), 955-958.
Wolf, S., et al., "Silicon Processing for the VLSI Era. Vol. 1 – Process Technology", Lattice Press, Sunset Beach, CA, (1986), 514-538.
Wolf, S., "Chapter 4: Multilevel-Interconnect Technology for VLSI and ULSI", Silicon Processing for the VLSI Era, Vol. 2 Process Integration, Lattice Press, Sunset Beach, CA, (1990), 176-297.
Zhang, F, et al., "Nanoglass/sup TM/ E copper damascene processing for etch, clean, and CMP", Proceedings of the IEEE 2001 International Interconnect Technology Conference, (2001), 57-9.
AMERICAN SOCIETY FOR METALS, "Properties and Selection: Nonferrous Alloys and Pure Metals", Metals Handbook. 9th ed., Vol. 2, Metals Park, Ohio, (1979), Table of Contents.
Van Horn, K. R., "Aluminum Vol. III Fabrication and Finishing", American Society for Metals, Metals Park, OH, (1967), 468.
Murarka, S. P., et al., Topper Metallization for ULSI and Beyond", Critical Reviews in Solid State and Materials Sciences 20 2 (1995), 87-124.
Bai, G.,"Copper Interconnection Deposition Techniques and Integration", 1996 Symposium on VLSI Technoloav, Digest of Technical Papers, (1996), pp. 48-49.
Bhansali, S., et al., "Selective seeding of copper films on polyimide-patterned silicon substrate, using ion implantation", Sensors and Actuators A: Physical, 52 1 March 1996, 126-131. --.

In column 3, line 66, after "invention" delete "." and insert -- ; --, therefor.

In column 4, line 22, delete "unhoped" and insert -- undoped --, therefor.

In column 11, line 52, delete "copending" and insert -- co-pending --, therefor.

In column 13, line 54, in Claim 1, before "seed" insert -- discontinuous --.

In column 13, line 56, in Claim 1, after "on" delete "the substrate" and insert -- a semiconductor substrate, wherein individual elements of the discontinuous seed layer are substantially isolated from each other --, therefor.

UNITED STATES PATENT AND TRADEMARK OFFICE
CERTIFICATE OF CORRECTION

| | |
|---|---|
| PATENT NO. | : 7,211,512 B1 |
| APPLICATION NO. | : 09/483881 |
| DATED | : May 1, 2007 |
| INVENTOR(S) | : Ahn et al. |

It is certified that error appears in the above-identified patent and that said Letters Patent is hereby corrected as shown below:

In column 13, line 63, in Claim 1, after "layer" insert -- and exposed portions of the seed layer --.

In column 14, line 9, in Claim 5, before "seed" insert --discontinuous --.

In column 14, line 10, in Claim 5, delete "(Cu)having" and insert -- (Cu) having --, therefor.

In column 14, line 10, in Claim 5, before "discontinuous" delete "a".

In column 14, lines 10–11, in Claim 5, delete "island structure on the" and insert -- islands on a semiconductor --, therefor.

In column 14, line 12, in Claim 5, delete "technique;" and insert -- technique, wherein the discontinuous islands are substantially electrically isolated from each other; --, therefor.

In column 14, line 16, in Claim 5, after "layer;" insert -- and --.

In column 14, lines 20-21, in Claim 6, delete "having a discontinuous island structure includes a discontinuous island structure" and insert -- includes discontinuous islands --, therefor.

In column 14, line 25, in Claim 7, delete "vias, wherein the number of copper vias form" and insert -- structures, wherein copper structures are formed --, therefor.

In column 14, line 28, in Claim 8, delete "vias" and insert -- structures --, therefor.

In column 14, line 35, in Claim 10, after "first" insert -- discontinuous --.

In column 14, line 36, in Claim 10, delete "substrate;" and insert -- semiconductor substrate, wherein individual elements of the first discontinuous seed layer are substantially electrically isolated from each other; --, therefor.

In column 14, line 40, in Claim 10, after "of" delete "or".

In column 14, line 45, in Claim 10, after "second" insert -- discontinuous --.

In column 14, line 46, in Claim 10, after "(Pd)" insert -- or --.

UNITED STATES PATENT AND TRADEMARK OFFICE
CERTIFICATE OF CORRECTION

| | |
|---|---|
| PATENT NO. | : 7,211,512 B1 |
| APPLICATION NO. | : 09/483881 |
| DATED | : May 1, 2007 |
| INVENTOR(S) | : Ahn et al. |

It is certified that error appears in the above-identified patent and that said Letters Patent is hereby corrected as shown below:

In column 14, line 65, in Claim 13, after "first" delete "number of".

In column 14, line 66, in Claim 13, delete "form" and insert -- are formed --, therefor.

In column 15, line 14, in Claim 17, before "seed" insert -- discontinuous --.

In column 15, line 14, in Claim 17, delete "substrate" and insert -- semiconductor substrate, wherein individual elements of the first discontinuous seed layer are substantially electrically isolated from each other --, therefor.

In column 15, line 19, in Claim 17, delete "plating;" and insert -- plating to a top surface of the first photoresist layer; --, therefor.

In column 15, line 20, in Claim 17, after "second" insert -- discontinuous --.

In column 15, line 28, in Claim 17, after "third" insert -- discontinuous --.

In column 15, line 38, in Claim 18, after "fourth" insert -- discontinuous --.

In column 16, line 3, in Claim 25, after "first" insert -- discontinuous --.

In column 16, line 4, in Claim 25, before "substrate" insert -- semiconductor --.

In column 16, line 5, in Claim 25, delete "process;" and insert -- process, wherein individual elements of the first discontinuous seed layer are substantially electrically isolated from each other; --, therefor.

In column 16, line 11, in Claim 25, after "plating" insert -- to a top surface of the first photoresist layer --.

In column 16, line 12, in Claim 25, after "second" insert -- discontinuous --.

In column 16, line 19, in Claim 25, after "third" insert -- discontinuous --.

In column 16, line 50, in Claim 31, after "first" insert -- discontinuous --.

In column 16, line 51, in Claim 31, delete "substrate;" and insert -- semiconductor substrate, wherein individual elements of the first discontinuous seed layer are substantially electrically isolated from each other; --, therefor.

In column 16, line 57, in Claim 31, after "second" insert -- discontinuous --.

UNITED STATES PATENT AND TRADEMARK OFFICE
CERTIFICATE OF CORRECTION

PATENT NO. : 7,211,512 B1
APPLICATION NO. : 09/483881
DATED : May 1, 2007
INVENTOR(S) : Ahn et al.

It is certified that error appears in the above-identified patent and that said Letters Patent is hereby corrected as shown below:

In column 16, line 65, in Claim 31, after "third" insert -- discontinuous --.

In column 17, line 3, in Claim 31, after "layer;" delete "and".

In column 17, line 6, in Claim 31, after "fourth" insert -- discontinuous --.

In column 18, line 11, in Claim 37, delete "wherein the further includes" and insert -- further including --, therefor.

In column 18, line 14, in Claim 37, after "and" insert -- on --.

Signed and Sealed this

Twenty-first Day of August, 2007

JON W. DUDAS
*Director of the United States Patent and Trademark Office*